United States Patent [19]

Yamagata et al.

[11] Patent Number: 5,404,329
[45] Date of Patent: Apr. 4, 1995

[54] BOOSTING CIRCUIT IMPROVED TO OPERATE IN A WIDER RANGE OF POWER SUPPLY VOLTAGE, AND A SEMICONDUCTOR MEMORY AND A SEMICONDUCTOR INTEGRATED CIRCUIT DEVICE USING THE SAME

[75] Inventors: Tadato Yamagata; Yoshikazu Morooka, both of Hyogo, Japan

[73] Assignee: Mitsubishi Denki Kabushiki Kaisha, Tokyo, Japan

[21] Appl. No.: 92,109

[22] Filed: Jul. 16, 1993

[30] Foreign Application Priority Data

Dec. 17, 1992 [JP] Japan ................... 4-337143

[51] Int. Cl.⁶ .............................. H03K 4/58
[52] U.S. Cl. ................ 365/189.09; 365/149; 365/189.11; 327/530; 327/534; 327/589
[58] Field of Search ............. 365/189.09, 189.11, 365/149; 307/296.1, 296.2, 482, 578

[56] References Cited

U.S. PATENT DOCUMENTS

| | | |
|---|---|---|
| 4,398,100 | 8/1983 | Tobita et al. |
| 4,716,303 | 12/1987 | Mimoto .................. 307/482 |
| 4,772,812 | 9/1988 | Desmarais .............. 307/482 |
| 5,059,816 | 10/1991 | Kobatake ............... 307/482 |
| 5,185,721 | 2/1993 | Love et al. ............. 365/189.11 |
| 5,268,600 | 12/1993 | Yeu ....................... 307/578 |

FOREIGN PATENT DOCUMENTS

| | | |
|---|---|---|
| 0055601A2 | 7/1982 | European Pat. Off. |
| 0233734A2 | 8/1987 | European Pat. Off. |
| 63-227211 | 9/1988 | Japan. |
| 2-177716 | 7/1990 | Japan. |
| 2175162 | 11/1986 | United Kingdom. |

Primary Examiner—Eugene R. LaRoche
Assistant Examiner—Vu Le
Attorney, Agent, or Firm—Lowe, Price, LeBlanc & Becker

[57] ABSTRACT

A boosting circuit is provided applicable in various semiconductor integrated circuits such as a word line boosting circuit in a semiconductor memory. Because a backgate electrode of a PMOS transistor connected between power supply potential and an output node is connected to the output node, the output node is precharged to the Vcc level during a boosting term. Therefore, the boosting condition by a MOS capacitor is alleviated in comparison with a conventional boosting circuit. Proper boosting operation can be carried out even at a lower level of a supplied power supply voltage. Therefore, operable margin of power supply voltage is enlarged.

15 Claims, 23 Drawing Sheets

BOOSTING CIRCUIT IMPROVED TO OPERATE IN A WIDER RANGE OF POWER SUPPLY VOLTAGE, AND A SEMICONDUCTOR MEMORY AND A SEMICONDUCTOR INTEGRATED CIRCUIT DEVICE USING THE SAME

CROSS-REFERENCE TO RELATED COPENDING APPLICATION

Related, copending application of particular interest to the instant application is U.S. Ser. No. 08/025,470, entitled "Improved Static Random Access Memory Device Having a Single Bit Line Configuration", filed Mar. 3, 1993 and assigned to the same assignee of the instant application.

BACKGROUND OF THE INVENTION

1. Field of the Invention

The present invention generally relates to boosting circuits, and more particularly to a boosting circuit improved to operate stably in a wider range of power supply voltage. The present invention has particular applicability to a semiconductor memory such as a dynamic random access memory (DRAM) and a static random access memory (SRAM).

2. Description of the Background Art

A boosting circuit is used in various circuits in a semiconductor integrated circuit device for generating a boosted voltage exceeding a predetermined power supply voltage level. For example, a boosting circuit is used in semiconductor memories such as dynamic random access memories and static random access memories for boosting a selected word line to a level higher than the power supply voltage. The present invention is applicable to boosting circuits in various semiconductor integrated circuit devices. In the following, a conventional boosting circuit, and then the problems thereof will be described hereinafter.

FIG. 31 is a circuit diagram of a conventional boosting circuit. Referring to FIG. 31, a boosting circuit includes an NMOS transistor Q21 connected between power supply potential Vcc and an output node N1, and an MOS capacitor C0 connected to output node N1 for boosting. Transistor Q21 has its gate connected to power supply potential Vcc. A parasitic capacitance C21 exists in output node N1. It is assumed that transistor Q21 has a threshold voltage of Vth1.

In operation, output node N1 is precharged to potential Vcc−Vth1 prior to boosting. At the time of boosting, when a clock signal S2 is boosted from ground potential to power supply potential Vcc, the potential $V_{N1}$ of output node N1 is boosted as represented in the following equation due to the capacitive coupling of MOS capacitor C0.

$$V_{N1} = Vcc - Vth1 + \{C0/(C0+C21)\} \cdot Vcc \quad (1)$$

For example, when Vcc=5 volts, Vth1=1 volt, and C0=2·C21, potential $V_{N1}$ becomes approximately 7.3 volts after boosting.

The precharge voltage level of output node N1 must be greater than the threshold voltage Vth0 of MOS capacitor C0 for the boosting circuit of FIG. 31 to operate properly. That is to say, because an inversion layer must be formed below the gate electrode of MOS capacitor C0 prior to boosting, the above condition, i.e. Vcc−Vth1>Vth0 must be satisfied. This condition is represented by the following inequality.

$$Vcc > Vth0 + Vth1 \quad (2)$$

Assuming that Vth0=1.5 volts, and Vth1=1.0 volts, for example, the boosting circuit of FIG. 31 cannot properly operate if the condition of Vcc>2.5 volts is not satisfied. In other words, the boosting circuit of FIG. 3 can operate properly only under the power supply voltage Vcc of not less than 2.5 volts.

FIG. 32 shows the range of power supply voltage Vcc in which the boosting circuit can operate properly. As shown in FIG. 32 (a), the conventional boosting circuit shown in FIG. 31 can operate properly in the range where power supply voltage Vcc is more than approximately 2.5 volts.

The recent trend is towards reduced power supply voltage level under the requirements of higher integration degree and lower power consumption of a semiconductor device. That is to say, the application of a lower power supply voltage to a semiconductor device allows a thinner insulation film such as of MOS transistors and MOS capacitors, resulting in a higher integration density. Also, power consumption can be reduced.

Under such circumstances, a conventional boosting circuit that can properly operate only under the condition of a power supply voltage Vcc greater than 2.5 volts could not be widely applied to a semiconductor device. In other words, the application of a conventional boosting circuit was limited under the trend of a lower power supply voltage due to its small operational margin of the power supply voltage. Furthermore, the reduction (or loss) of the boosted voltage level by threshold voltage Vth1 in the output voltage of the boosting circuit of FIG. 31 was not desired under the requirement of a lower power supply voltage.

SUMMARY OF THE INVENTION

An object of the present invention is to provide a boosting circuit that can operate properly in a wider range of power supply voltage.

Another object of the present invention is to provide a boosting circuit that can operate properly under a lower power supply voltage.

A further object of the present invention is to provide a boosting circuit that can provide a higher boosted voltage.

Still another object of the present invention is to provide a semiconductor integrated circuit device that can operate properly under a lower power supply voltage.

A still further object of the present invention is to provide a static random access memory having a single bit line configuration that can operate properly under a lower power supply voltage.

Yet a further object of the present invention is to provide a dynamic random access memory that can operate properly under a lower power supply voltage.

A boosting circuit according to the present invention includes a clock signal generating circuit for generating a clock signal defining a non-boosting term and a boosting term, a capacitor having a first electrode connected to receive a clock signal and a second electrode connected to an output node, a forcing circuit connected between a first power supply potential and an output node, responsive to a clock signal for forcing the output node to the first power supply potential during a non-boosting term and made non-conductive during a boosting term.

In operation, the output node is forced to the first power supply potential by the forcing circuit during a non-boosting term. Therefore, a high boosted voltage can be generated even if a lower power supply potential is applied.

According to another aspect of the present invention, a boosting circuit includes a clock signal generating circuit for generating first and second complementary clock signals for boosting, a MOS capacitor having a first electrode connected to receive the first complementary clock signal and a second electrode connected to an output node, a first field effect transistor of a first conductivity type connected between a first power supply potential and the output node, and having a backgate electrode connected to the output node, a second field effect transistor of the first conductivity type connected between the output node and the gate electrode of the first field effect transistor, and a third field effect transistor of a second conductivity type opposite to the first conductivity type, connected between a second power supply potential and the gate electrode of the first field effect transistor. The second and third field effect transistors have their gate electrodes connected to receive the second complementary clock signal.

In operation, because the back gate electrode of the first field effect transistor is connected to the output node, current flows from the output node to the first power supply potential at the time of boosting when the first field effect transistor is of, for example, P type. Therefore, this prevents the boosting operation from not being carried out properly. As a result, a proper boosting operation can be carried out even if a lower power supply voltage is applied.

According to a further aspect of the present invention, a static random access memory device includes a memory cell array having a plurality of memory cells arranged in a matrix of a plurality of rows and columns, and a plurality of bit lines each connected to a corresponding one column of memory cells. Each memory cell includes a data storage circuit for storing a data signal provided via a single input/output node, and first and second field effect transistors connected in series between the bit line in the corresponding column and the input/output node. This static random access memory device further includes a first boosting circuit responsive to an externally applied write control signal for boosting the gate voltage of the respective first field effect transistors in the memory cells of a row selected by a row address signal to a voltage level exceeding the power supply voltage applied to the data storage circuit, and a second boosting circuit responsive to an externally applied write control signal for boosting the gate voltage of the respective second field effect transistors in the memory cells of a column selected by a column address signal to a voltage level exceeding the power supply voltage. Each of first and second boosting circuits is implemented by the boosting circuit described in claim 1, and the clock signal generating circuit generates a clock signal in response to a write control signal.

According to still another aspect of the present invention, a semiconductor integrated circuit device includes first and second data lines for transmitting data, a field effect transistor connected between the first and second data lines, and a boosting circuit for boosting the control gate electrode of the field effect transistor in a data transmission mode. The boosting circuit includes a clock signal generating circuit for generating a clock signal to define a non-boosting term and a boosting term, and a capacitor having a first electrode connected to receive a clock signal, and a second electrode connected to the output node. A non-boosting term includes first and second non-boosting terms. The boosting circuit further includes a first forcing circuit for forcing the output node to a first power supply potential during the first non-boosting term, and for forcing the output node to a high impedance state during a boosting term, and a second forcing circuits for forcing the output node to a second power supply potential during the second non-boosting term, and made non-conductive during the boosting term and the first non-boosting term.

According to a still further aspect of the present invention, a dynamic random access memory device includes an amplifier circuit for amplifying a data signal on a data line, first and second memory cells for storing the data, a first bit line connected to the first memory cell for transmitting a data signal provided from the first memory cell, a first field effect transistor connected between the data line and the first bit line, and having a control gate electrode, a second bit line connected to the second memory cell for transmitting a data signal provided from the second memory cell, a second field effect transistor connected between the data line and the second bit line, and having a control gate electrode, and an alternate boosting circuit for boosting and forcing to ground potential the control gate electrodes of the first and second field effect transistors alternately. The alternate boosting circuit includes first and second boosting circuits for providing alternately a boosted voltage. Each of the first and second boosting circuits includes a clock signal generating circuit for generating a clock signal defining a non-boosting term and a boosting term, and a capacitor having a first electrode connected to receive a clock signal and a second electrode connected to the output node. The non-boosting term includes first and second non-boosting terms. Each boosting circuit further includes a first forcing circuit connected between a first power supply potential and the output node for forcing the output node to the first power supply potential during the first non-boosting term, and forcing the output node to a high impedance state during the boosting term, and a second forcing circuit connected between a second power supply potential and the output node for forcing the output node to the second power supply potential during the second non-boosting term, and made non-conductive during the boosting term and the first non-boosting term.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
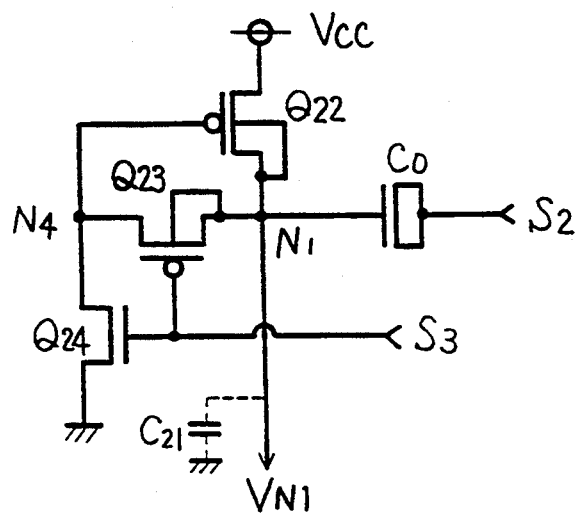
FIG. 1 is a circuit diagram of a boosting circuit according to an embodiment of the present invention.

Referring to FIG. 1, a boosting circuit includes PMOS transistors Q22 and Q23, an NMOS transistor Q24, and a MOS capacitor C0 for boosting. Transistor Q22 is connected between a power supply potential Vcc and an output node N1. Transistor Q22 has its backgate electrode connected to output node N1. Transistor Q23 is connected between output node N1 and the gate electrode (node N4) of transistor Q22. Transistor Q24 is connected between node N4 and ground potential.

MOS capacitor C0 has its gate electrode connected to output node N1. MOS capacitor C0 has its drain electrode and source electrode connected to receive a clock signal S2 for boosting. Transistors Q23 and Q24 have their gate electrodes connected to receive an inverted clock signal S3. It is assumed that parasitic capacitance C21 exists in output node N1.

Figure 2:
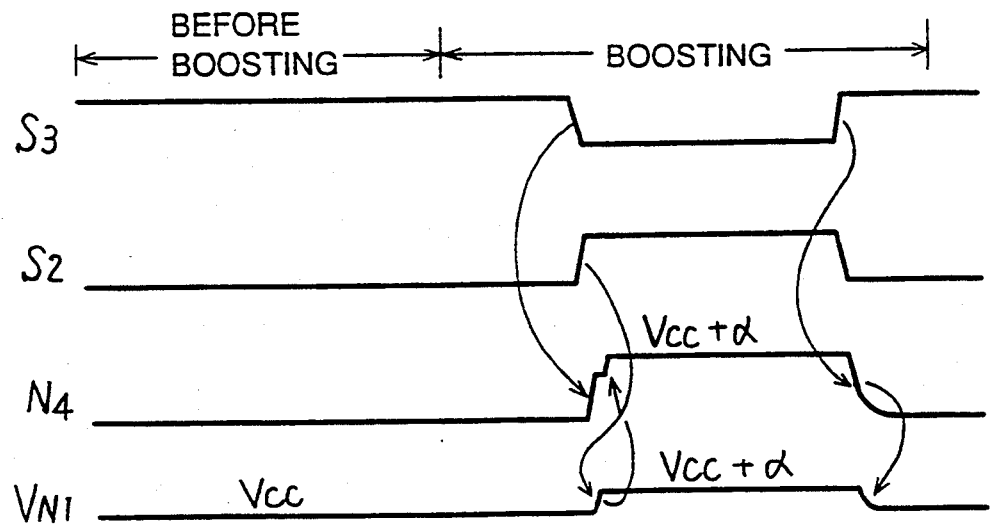
FIG. 2 is a timing chart for describing the operation of the boosting circuit of FIG. 1.

FIG. 2 is a timing chart for describing the operation of the boosting circuit of FIG. 1. Referring to FIGS. 1 and 2, signal S3 of a high level (for example Vcc) and a signal S2 of a low level (for example ground potential) are supplied during the term prior to boosting. In response to signal S3, transistor Q24 is turned on and transistor Q23 is turned off. Because ground potential is applied to the gate electrode of transistor Q22 via transistor Q24 (refer to the potential of node N4 of FIG. 2), transistor Q22 conducts. As a result, output node N1 is precharged to the level of power supply potential Vcc during the term prior to boosting (refer to $V_{N1}$ of FIG. 2).

At the start of a boosting term, signal S2 is brought to a high level, and signal S3 is pulled down to ground potential. In response to signal S3, transistor Q23 is turned on and transistor Q24 is turned off. Because of the conduction of transistor Q23, the potential of node N4 rises to the potential of output node N1, i.e. the precharged potential of Vcc, whereby transistor Q24 is turned off. Thus, the source and the gate of transistor Q22 are held at substantially the same potential, so that transistor Q22 is held OFF. As a result, a high impedance state during the boosting state is realized at the node.

Furthermore, in response to the rise of signal S2, the potential of output node N1 is boosted to Vcc+α due to the capacitive coupling of MOS capacitor C0. More specifically, boosted voltage $V_{N1}$ having the boosted potential of Vcc+α is provided via output node N1.

The boosted voltage $V_{N1}$ is represented by the following equation:

$$V_{N1} = Vcc + \{C0/(C0+C21)\} \cdot Vcc \qquad (3)$$

For example, when Vcc=3 volts and C0=2·C21, output node N1 is raised from 3 volts to 5 volts. In other words, a boosted voltage $V_{N1}$ of 5 volts is provided.

Figure 3:
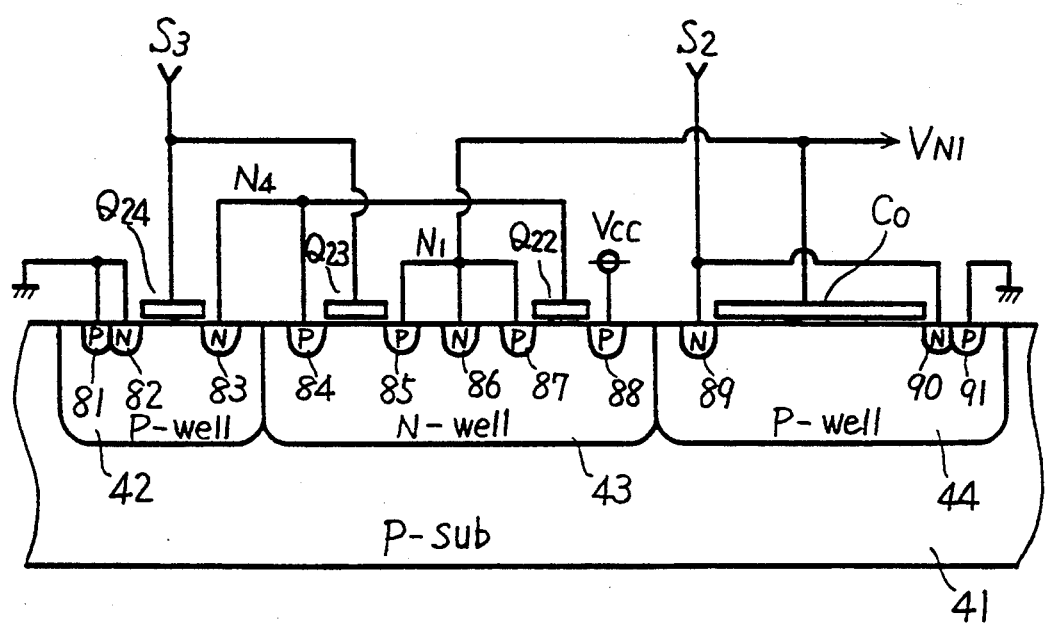
FIG. 3 is a sectional structure view of the boosting circuit of FIG. 1 on a semiconductor substrate.

FIG. 3 is a sectional structural view of the boosting circuit of FIG. 1 on a semiconductor substrate. Referring to FIG. 3, P type wells 42 and 44 and an N type well 43 are formed in the proximity of the main surface in a P type silicon substrate 41. A P type impurity region (or diffusion region) 81 is formed in P type well 42 to implement the backgate electrode of transistor Q24. N type impurity regions (or diffusion regions) 82 and 83 are formed in P type well 42 to implement the source and drain electrodes of transistor Q24.

P type impurity regions 84 and 85 are formed in N type well 43 to implement the source/drain electrodes of transistor Q23. P type impurity regions 87 and 88 are formed in N type well 43 to implement the source and drain electrodes of transistor Q22. N type impurity region 86 formed in N type well 43 forms the backgate electrode of transistors Q22 and Q23.

N type impurity regions 89 and 90 are formed in P type well 44 to implement one electrode of MOS capacitor C0. The gate electrode of MOS capacitor C0 implements the other electrode. P type impurity region 91 formed in P type well 44 implements the backgate electrode of MOS capacitor C0.

Figure 4:
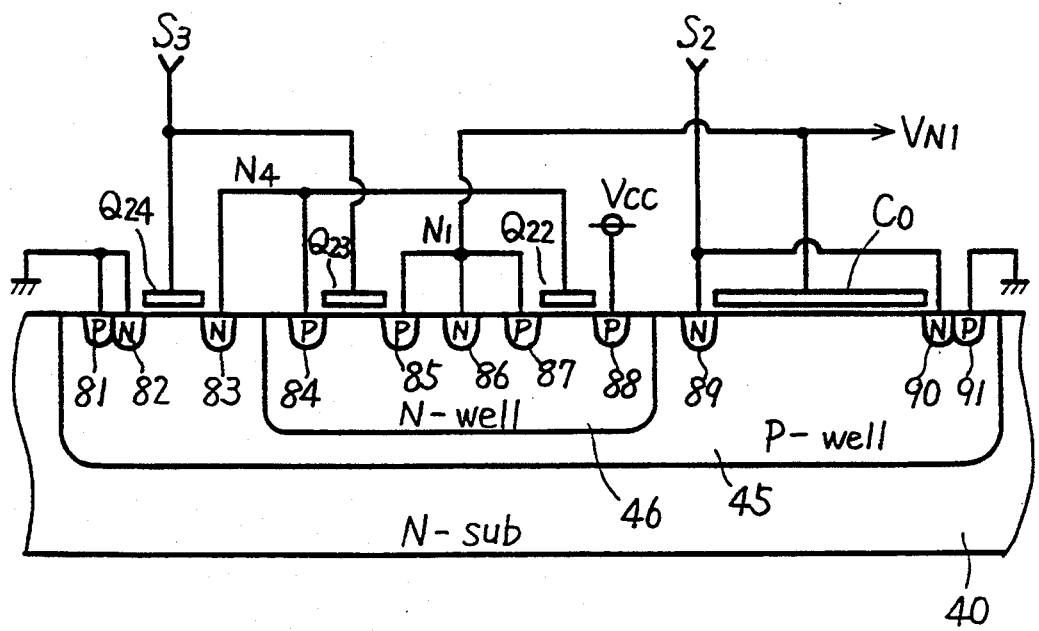
FIG. 4 is a sectional structure view of a boosting circuit according to another embodiment of the present invention.

FIG. 4 is a sectional structure view of a boosting circuit according to another embodiment of the present invention. Referring to FIG. 4, this boosting circuit has a double well structure. More specifically, a P type well 45 is formed in N type silicon substrate 40. An N type well 46 is formed in P type well 45. Impurity regions 81 and 91 are formed in P type well 45 and N type well 46, whereby transistors Q22–Q24 and MOS capacitor C0 are formed.

Referring to FIG. 1 again, the backgate electrode of PMOS transistor Q22 is connected to output node N1. Therefore, although the parasitic capacitance at output node N1 is increased due to PN junction capacitance between P type substrate 41 and N well 43, the increased amount is approximately not more than 1% of the parasitic capacitance of node N1 with almost no influence on the boosting operation. If the backgate electrode of transistor Q22 is connected to power supply potential Vcc, the following problems will occur.

Figure 5:
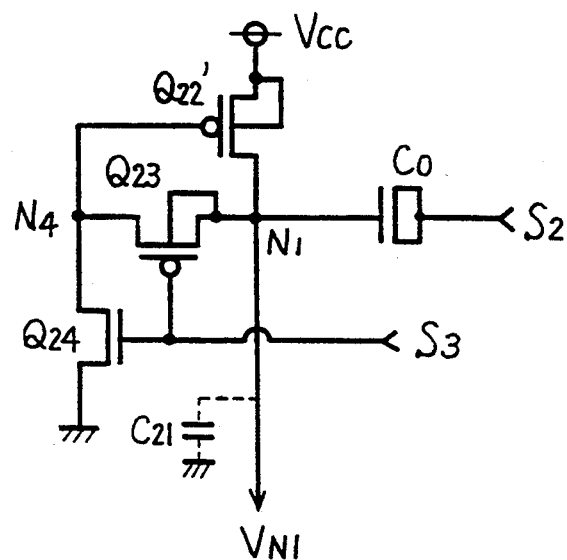
FIG. 5 is a circuit diagram of a boosting circuit including a PMOS transistor Q22' having a backgate electrode connected to a power supply potential.

Referring to FIG. 5 showing a boosting circuit similar to that of FIG. 1, a PMOS transistor Q22' has its backgate electrode connected to power supply potential Vcc. The structure of other components in this circuit is similar to those of the boosting circuit shown in FIG. 1. A sectional structural diagram of the boosting circuit of FIG. 5 is shown in FIG. 6.

Figure 6:
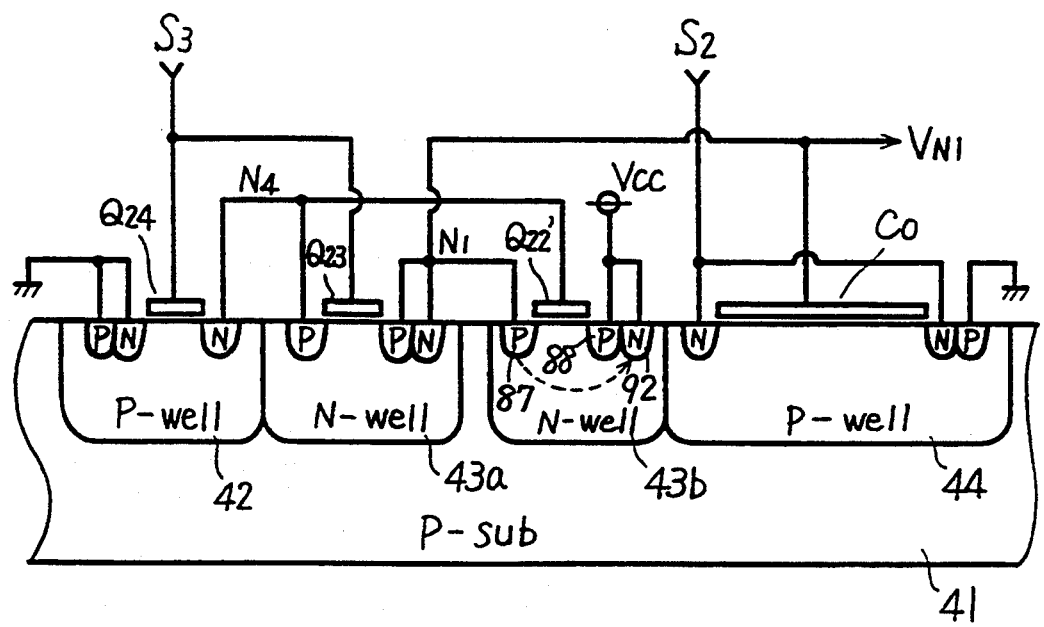
FIG. 6 is a sectional structure view of the boosting circuit of FIG. 5.

Referring to FIG. 6, N type wells 43a and 43b are formed in a P type silicon substrate 41. P type impurity regions 87 and 88 are formed in N type well 43b to implement a transistor Q22'. An N type impurity region 92 formed in N type well 43b implements the backgate electrode of transistor Q22'. Impurity regions 88 and 92 are connected to power supply potential Vcc.

The boosting circuit of FIG. 6 is supplied with a signal S2 of a high level and a signal S3 of a low level during a boosting term. This means that output node N1 is boosted to Vcc+α during the boosting term, whereby the PN junction between P type impurity region 87 and N type well 43b is biased in the forward direction. As a result, current flows from output node N1 towards N type impurity region 92 via P type impurity region 87 and N type well 43b, as shown in FIG. 6. The voltage $V_{N1}$ of boosted output node N1 is reduced by this current.

More specifically, assuming that the built-in potential is $V_D$ in the PN junction formed by P type impurity region 87 and N type well 43b, current flows from output node N1 towards power supply potential Vcc when the potential of output node N1 exceeds (Vcc+$V_D$). Therefore, the potential of output node N1 is limited to be not more than (Vcc+$V_D$). For example, assuming that Vcc=3 volts and $V_d$=0.8 volts, boosted voltage $V_{n1}$ is 3.8 volts, which is apparently reduced in comparison with the boosted voltage level (=5 volts) in the circuit of FIG. 1.

The boosting circuit having the sectional structure shown in FIG. 3 attains potential Vcc+α of N type well 43 when output node N1 is boosted to Vcc+α during the boosting term. Therefore, the PN junction between N type well 43 and P type impurity region 88 is biased in the opposite direction, so that current from output node N1 towards power supply potential Vcc does not flow. This means that the level of boosted voltage $V_{N1}$ is not reduced. Thus, the problem encountered in the boosting circuit of FIG. 5 is prevented.

Figure 7:
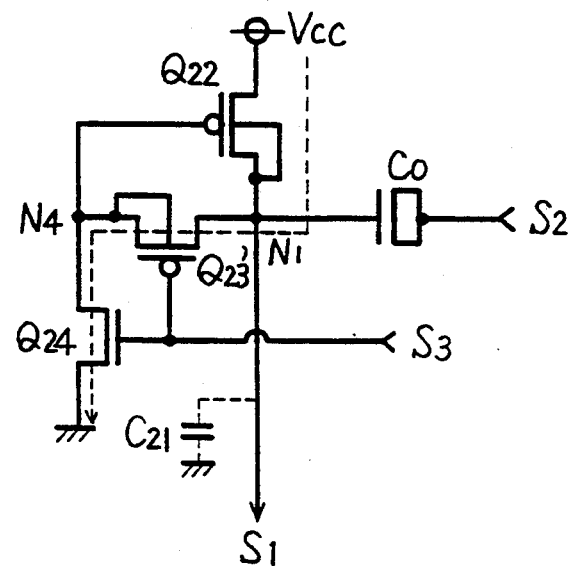
FIG. 7 is a circuit diagram of a boosting circuit including a PMOS transistor Q23' having a backgate electrode connected to a node N4.
Figure 8:
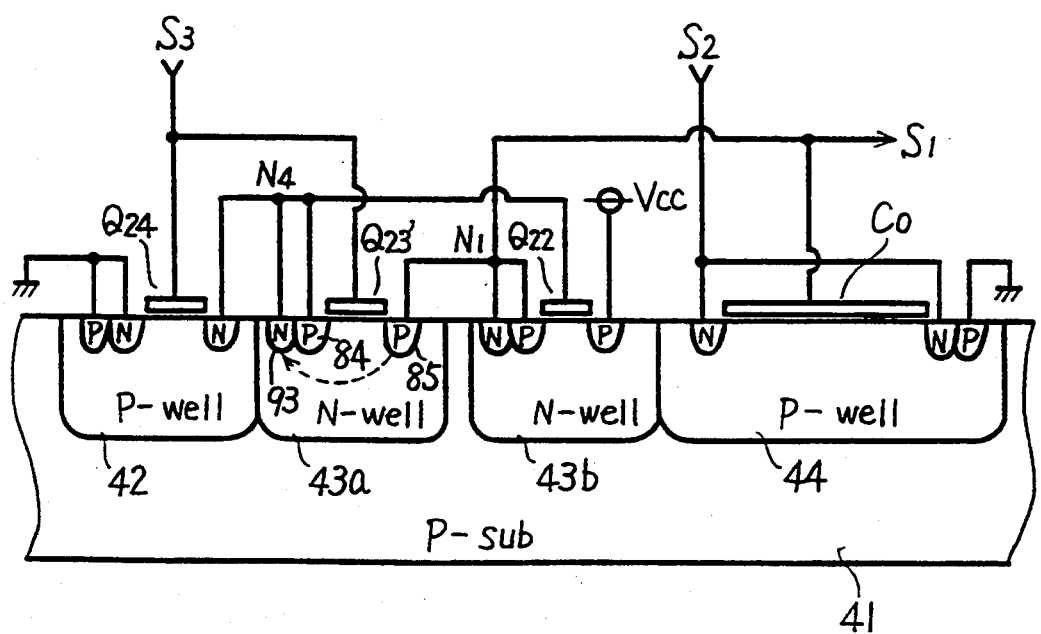
FIG. 8 is a sectional structure view of the boosting circuit of FIG. 7.

The problem occurring when the backgate electrode of transistor Q23 shown in FIG. 1 is connected to node N4 will be described. Referring to FIG. 7, the backgate electrode of PMOS transistor Q23' is connected to node N4. In this case, transistor Q23' has a sectional structure shown in FIG. 8. Referring to FIG. 8, an N type impurity region 93 serving as the backgate electrode of transistor Q23' is formed in N type well 43a. Impurity region 93 is connected to node N4.

A signal S1 of a low level and a signal S3 of a high level are supplied during the term prior to boosting. Because transistor Q24 becomes conductive in response to signal S3, node N4 attains ground potential. As a result, N type well 43a attains ground potential via N type impurity region 93. In contrast, transistor Q22 conducts in response to ground potential of node N4, whereby output node N1 attains power supply potential Vcc. As a result, the PN junction between P type impurity region 85 and N type well 43a is biased in the forward direction, whereby current flows from output node N1 towards node N4 as shown by the broken line of FIG. 8. More specifically, current flows from power supply potential Vcc towards ground potential via transistors Q22, Q23' and Q24 to increase power consumption. This current path is shown by a broken line in FIG. 7.

On the contrary, the boosting circuit having the sectional structure of FIG. 3 does not have the above-described current path because N type impurity region 86 forming the backgate electrode of transistor Q23 is connected to output node N1. More specifically, N type well 43 attains power supply potential Vcc during the term prior to boosting, whereby the PN junction between P type impurity region 84 and N type well 43 is biased in the opposite direction. Therefore, a current path is not formed.

Because the boosting circuit of FIG. 1 has output node N1 precharged to power supply potential Vcc during the term prior to boosting, the condition for this boosting circuit to carry out normal boosting operation is represented by the following inequality.

$$Vcc > Vth0 \qquad (4)$$

Figure 32:
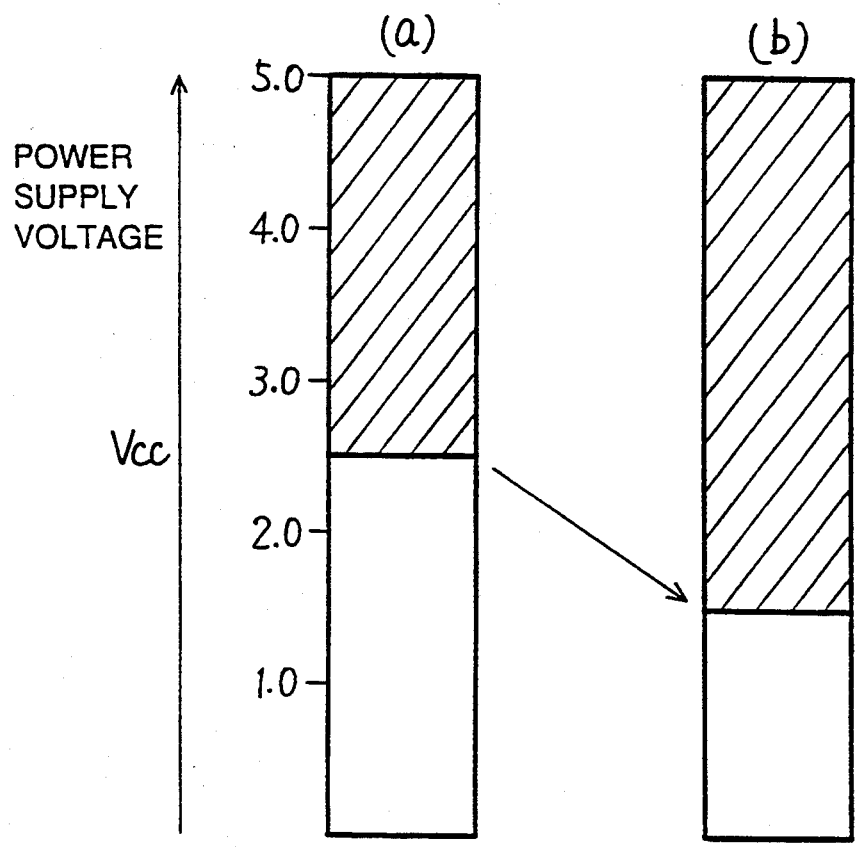
FIG. 32 is a graph showing a range of power supply voltage in which a boosting circuit can operate properly.

It can be appreciated by comparing the above inequality of (4) with the aforementioned inequality (2) that the range of power supply voltage for carrying out a proper boosting operation is increased by using the boosting circuit shown in FIG. 1. For example, assuming that Vth0=1.5 volts, the boosting circuit of FIG. 1 can operate properly in the range of Vcc>1.5 volts as shown in FIG. 32 (b). This means that a sufficient operable margin of power supply voltage is obtained even in the case where the boosting circuit of FIG. 1 is used in a semiconductor device where power supply voltage Vcc of 3 volts is applied.

In the following description, another embodiment of the present invention will be described as an application of the boosting circuit shown in FIG. 1. First, an embodiment in which the boosting circuit of FIG. 1 is applied to a SRAM having a single bit line configuration will be described, starting from the circuit structure and then its operation of a circuit of a SRAM having a single bit line configuration.

Figure 9:
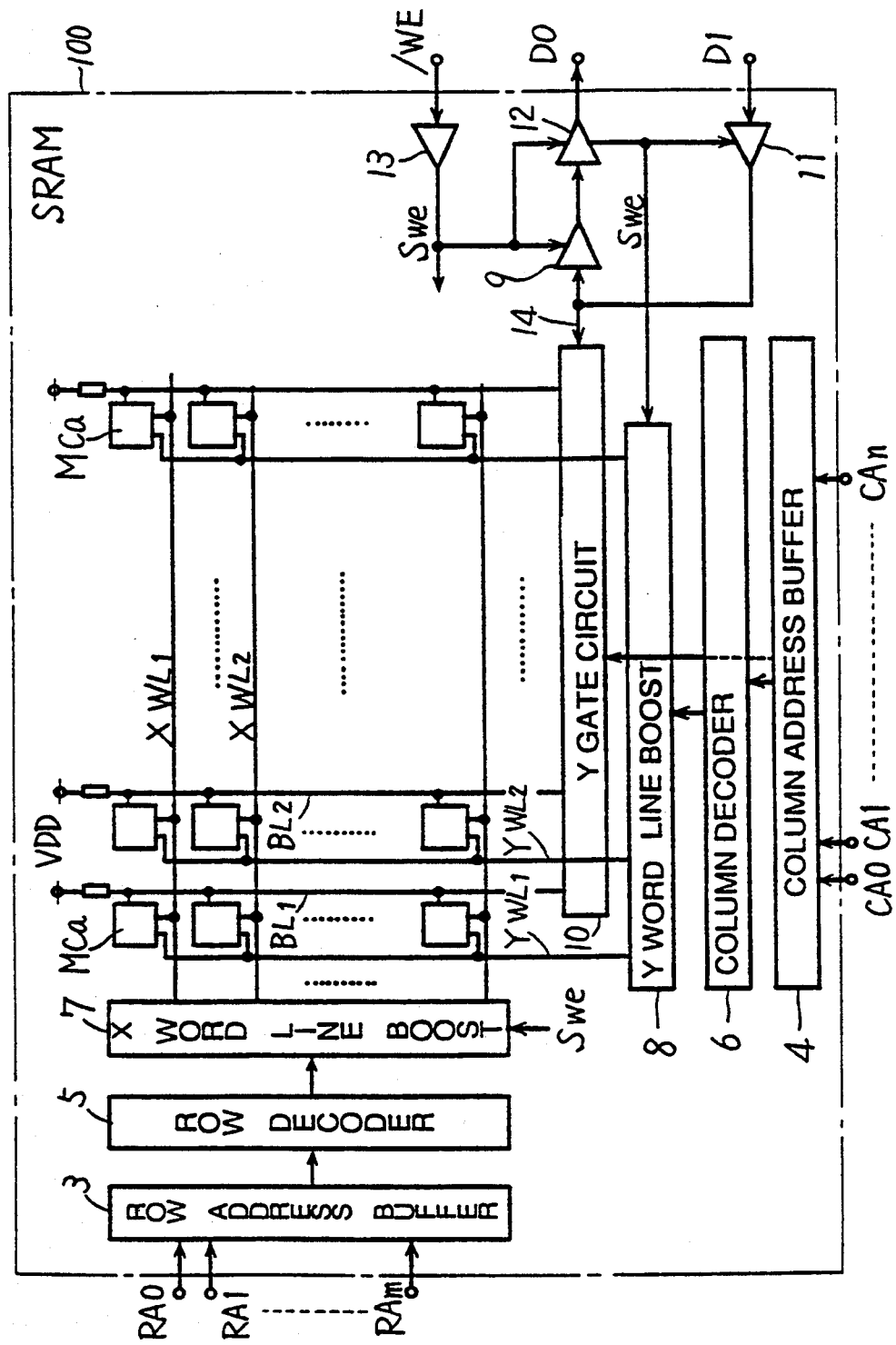
FIG. 9 is a block diagram of a SRAM having a single bit line configuration according to a further embodiment of the present invention.

FIG. 9 is a block diagram of a SRAM showing a further embodiment of the present invention. Referring to FIG. 9, a SRAM 100 includes a row address buffer 3 receiving an externally applied row address signal RA0–RAm, a column address buffer 4 receiving an externally applied column address signal CA0–CAn, a row decoder 5 for decoding a row address signal, a column decoder 6 for decoding a column address signal, an X word line boosting circuit 7 for boosting an X word line selected by the row decoder 5, a Y word line boosting circuit 8 for boosting a Y word line selected by the column decoder 6, and a Y gate circuit 10 responsive to an output signal from column decoder 6 for selecting a bit line.

SRAM 100 includes a memory cell array having a plurality of memory cells MCa arranged in a plurality of rows and columns. In each row, a memory cell MCa is connected to a corresponding word line XWL1, XWL2, ... In each column, memory cell MCa is connected to a corresponding bit line BL1, BL2, ..., and to a corresponding Y word line YWL1, YWL2, ... The X word lines XWL1, XWL2, ... are connected to X word line boosting circuit 7. Y word lines YWL1, YWL2, ... are connected to Y word line boosting circuit 8. Bit lines BL1, BL2, ... are connected to the Y gate circuit 10.

Bit lines BL1, BL2, ... are connected to a sense amplifier 9 via Y gate circuit 10 and an IO line 14. Y gate circuit 10 responds to a column selecting signal provided from column decoder 6 to selectively connect one of bit lines BL1, BL2, ... to IO line 14. Sense amplifier 9 is activated in response to a write enable signal/WE provided via write control buffer 13. The data signal read out from a memory cell is amplified by sense amplifier 9 to be provided via output buffer 12 as an output data Do. The data signal Di to be written is applied to the one bit line selected by Y gate circuit 10 via input buffer 11, IO line 14 and Y gate circuit 10.

Figure 10:
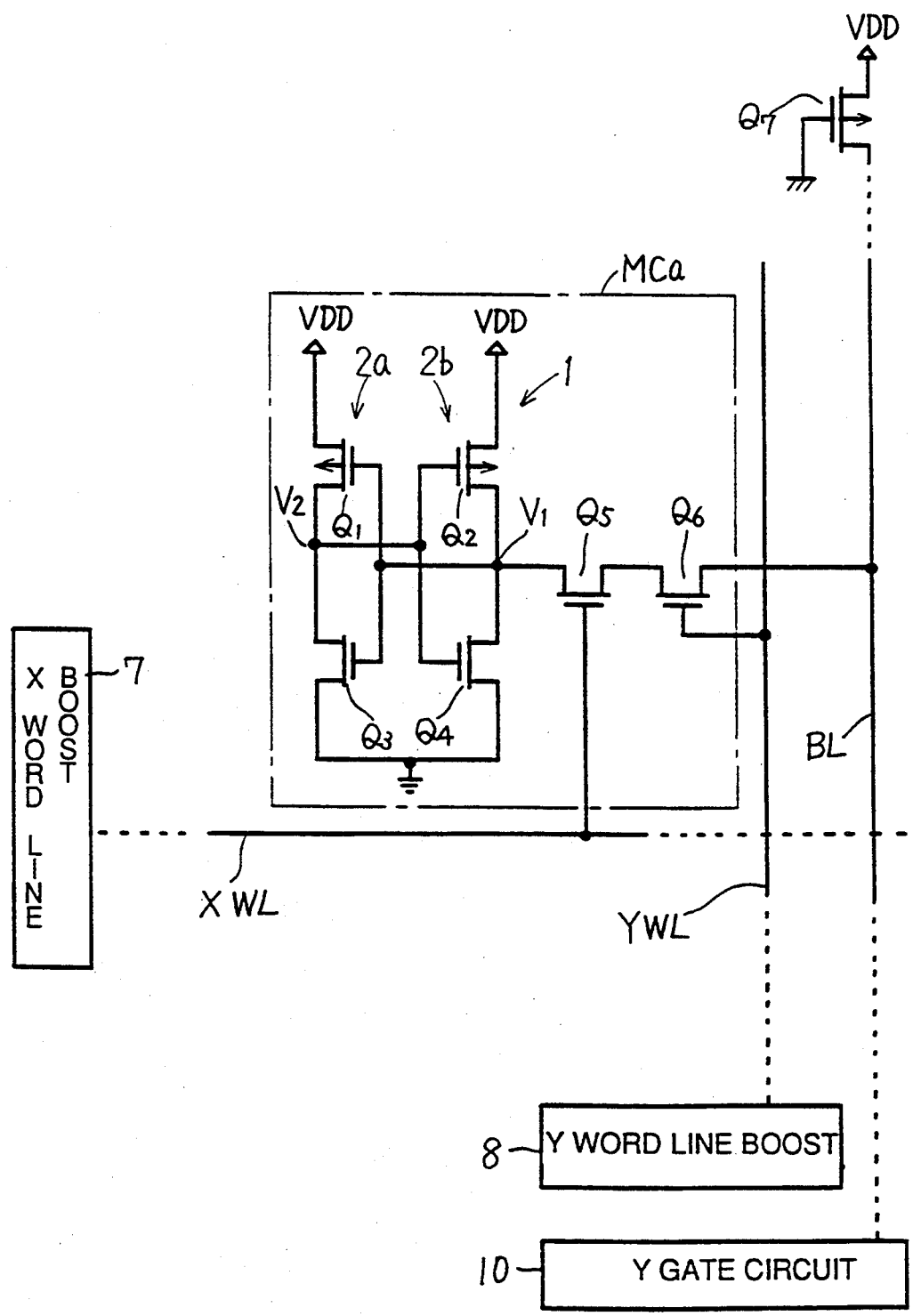
FIG. 10 is a circuit diagram of a memory cell used in the SRAM of FIG. 9.

FIG. 10 is a circuit diagram of one memory cell MCa employed in SRAM 100 of FIG. 9. Referring to FIG. 10, memory cell MCa includes a data storage circuit 1 implemented by PMOS transistors Q1 and Q2 realized by a thin film transistor (referred to as "TFT" hereinafter), and NMOS transistors Q3 and Q4 serving as driver transistors. More specifically, the data storage circuit 1 includes two cross-coupled CMOS inverters 2a and 2b. Inverter 2a is formed of transistors Q1 and Q3. Inverter 2b is formed of transistors Q2 and Q4.

Data storage circuit 1 is connected to a single bit line BL via NMOS transistors Q5 and Q6 serving as access gates. Transistor Q5 has the gate connected to X word line XWL. Transistor Q6 has the gate connected to Y word line YWL. Word lines XWL and YWL are connected to X word line boosting circuit 7 and Y word line boosting circuit 8, respectively. A PMOS transistor Q7 is connected between the single bit line BL and the power supply voltage VDD as a load. Although only one memory cell MCa is shown in FIG. 10, the other memory cells of FIG. 9 have the same circuit configuration.

The operation will be described hereinafter with reference to FIGS. 9 and 10. In writing operation, an externally applied write enable signal/WE is pulled down. The write control buffer 13 shown in FIG. 9 responds to the fall of the signal/WE to provide an internal write control signal Swe. Row decoder 5 decodes externally applied row address signals RA0–RAm to select one of the X word lines. X word line boosting circuit 7 responds to the internal write control signal Swe to boost the selected X word line XWL. Similarly, column decoder 6 decodes externally applied column address signals CA0–CAn to select a Y word line. Y word line boosting circuit 8 responds to the internal write control signal Swe to boost the selected Y word line XWL.

In writing operation, the input data Di to be written is provided to Y gate circuit 10 via input buffer 11. Y gate circuit 10 responds to a column select signal provided from column decoder 6 to provide the input data signal to the selected bit line.

Referring to FIG. 10, the word lines XWL and YWL are boosted by X word line boosting circuit 7 and Y word line boosting circuit 8, respectively, whereby the gate voltages of transistors Q5 and Q6 are boosted. In response to the boost of the gate voltages, transistors Q5 and Q6 are turned on at a lower conductance, whereby the data determined by the potential on the single bit line BL is stored in data storage circuit 1.

In the reading operation, boosting operation by word line boosting circuits 7 and 8 are not carried out, and word line boosting circuits 7 and 8 provide an output voltage of the level of the power supply voltage VDd, instead. More specifically, when the memory cell MCa of FIG. 10 is accessed, word line boosting circuits 7 and 8 provide an output voltage of the power supply voltage VDD level to word lines XWL and YWL. As a result, transistors Q5 and Q6 are turned on at the ordinary conductance, whereby the data signal stored in the data stored circuit 1 is provided on the single bit line BL.

The data signal provided to bit line BL is supplied to sense amplifier 9 via Y gate circuit 10 of FIG. 9. The signal amplified by sense amplifier 9 is provided via output buffer 12 as the output data Do.

The operation of the memory cell MCa shown in FIG. 10 is schematically described in the foregoing. The operation principle of the memory cell MCa will be described in details hereinafter.

Referring to FIG. 10 again, inverter 2a forming data storage circuit 1 is implemented by PMOS transistor Q1 and the NMOS transistor Q3 realized by TFT. It is assumed that an input voltage of inverter 2a is V1, and the output voltage is V2. Because transistor Q1 is formed of a TFT, the drain current y of transistor Q1 is obtained by the following equation assuming that the gate voltage of transistor Q1 is x.

$$y = 10^{-13} e^{\frac{1}{2} \log 2.7183 (1 \times 10 - 7)(x-3)} \qquad (5)$$

Figure 11:
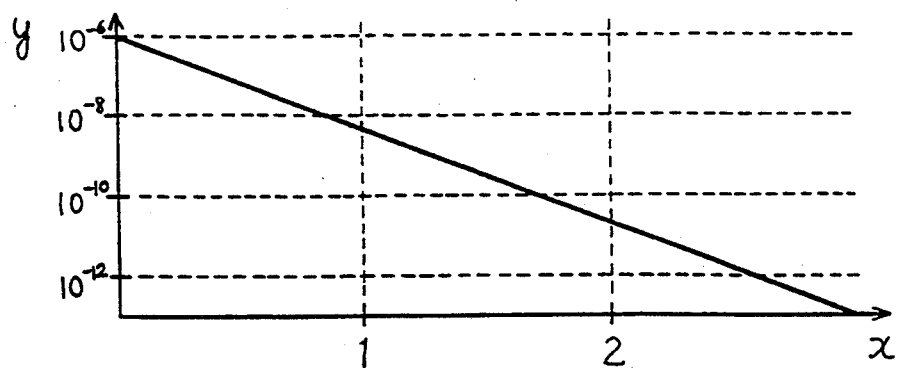
FIG. 11 is a characteristic diagram of gate voltage-drain current of a transistor Q1 shown in FIG. 10.

From equation (5), the gate voltage-drain current characteristics of transistor Q1 shown in FIG. 11 are obtained. It can be appreciated from FIG. 11 that transistor Q1 shows sub-threshold characteristics in the region where the gate voltage x is less than 3 volts.

It can be appreciated from FIG. 11 that a current not more than 1 μA flows via transistor Q1. In the current region not more than 1 μA, driver transistor Q3 also indicates sub-threshold characteristics. The drain current z of driver transistor Q3 in the sub-threshold region is expressed by THE following equation using the gate voltage x.

$$z = 10^{-18} e^{\frac{1}{1} \log 2.7183(1 \times 10^{10})x} \quad (6)$$

Figure 12:
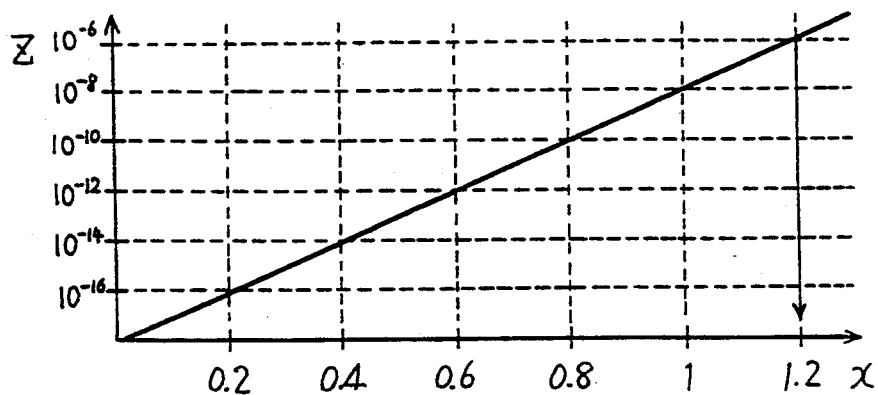
FIG. 12 is a characteristic diagram of gate electrode-drain current of a transistor Q3 of FIG. 10.

Therefore, the gate voltage-drain current characteristics of driver transistor Q3 is shown in FIG. 12.

It can be appreciated from the characteristics diagrams of FIGS. 11 and 12 that transistors Q1 and Q3 both operate in the sub-threshold region, and the output voltage V2 of inverter 2a is determined by the current flowing through transistors Q1 and Q3.

Figure 13:
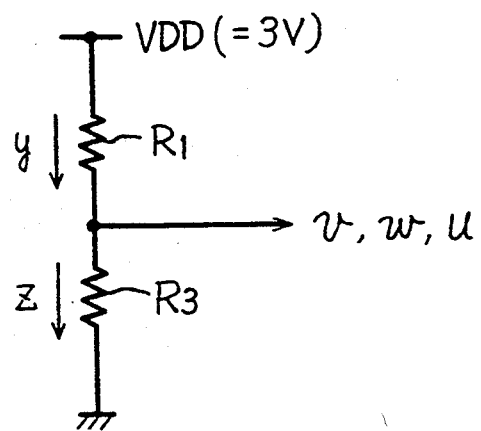
FIG. 13 is an equivalent circuit diagram of an inverter 2a of FIG. 10.

For the sake of simplicity, inverter 2a is indicated by the equivalent circuit diagram of FIG. 13. Specifically, it is assumed that transistor Q1 is substituted by a resistor R1 conducting a current flow of y, and transistor Q3 is substituted by a resistor R3 conducting a current flow of z. The output voltage v of the equivalent circuit of FIG. 13 is represented by the following equation assuming that the power supply voltage VDD is 3 volts.

$$v = \frac{y}{y+z} \cdot 3 \quad (7)$$

Assuming that a drain current of a certain value flows via transistor Q1, the output voltage v of inverter 2a indicated by the equivalent circuit of FIG. 13 is obtained by the following equation.

$$v = 3 \frac{e^{\frac{1}{2}\log 2.7183(1 \times 10^{-7})(x-3)}}{10^{13}\left[\frac{e^{\frac{1}{2}\log 2.7183[1 \times 10^{-7}][x-3]}}{10^{13}} + \frac{e^{\log 2.7183[1 \times 10^{10}]x}}{10^{18}}\right]} \quad (8)$$

In the case the drain current of transistor Q1 is decreased by one order of magnitude and the drain current of driver transistor Q3 is increased by one order of magnitude from the case of equation (8), the output voltage w of inverter 2a is obtained by the following equation.

$$w = 3 \frac{e^{\frac{1}{2}\log 2.7183(1 \times 10^{-7})(x-3)}}{10^{14}\left[\frac{e^{\frac{1}{2}\log 2.7183[1 \times 10^{-7}][x-3]}}{10^{14}} + \frac{e^{\log 2.7183[1 \times 10^{10}]x}}{10^{17}}\right]} \quad (9)$$

In the case where the drain current of transistor Q1 is increased by one order of magnitude and the drain current of driver transistor Q3 is decreased by one order of magnitude from the case of equation (8), the output voltage u of inverter 2a is obtained by the following equation.

$$u = 3 \frac{e^{\frac{1}{2}\log 2.7183(1 \times 10^{-7})(x-3)}}{10^{12}\left[\frac{e^{\frac{1}{2}\log 2.7183[1 \times 10^{-7}][x-3]}}{10^{12}} + \frac{e^{\log 2.7183[1 \times 10^{10}]x}}{10^{19}}\right]} \quad (10)$$

Figure 14:
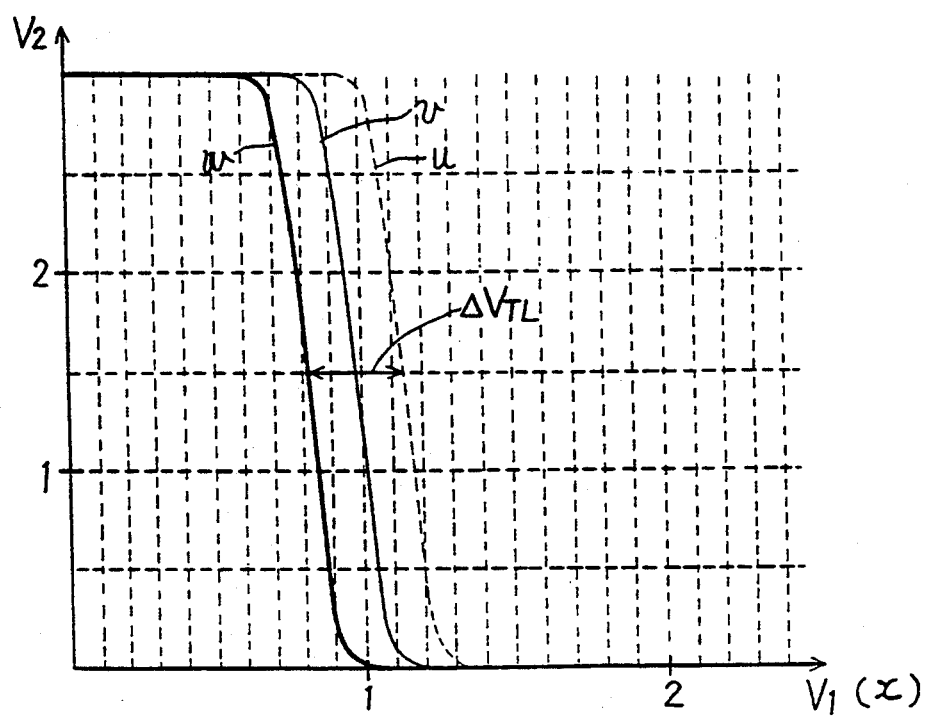
FIG. 14 is an input/output characteristic diagram of inverter 2a of FIG. 10.

The relationship between the output voltages of v, w and u of inverter 2a and the gate voltage x in the various cases of the above-described equations (8)–(10) is shown in FIG. 14.

FIG. 14 is a diagram of the input/output characteristics showing the relationship between the input voltage V1 and the output voltage V2 of inverter 2a. Referring to FIG. 14, the abscissa indicates the input voltage V1 (equivalent to the gate voltage x of transistors Q1 and Q3), and the ordinate indicates the output voltage V2 (corresponds to the aforementioned output voltages of v, w, and u). Curves v, w and u show the output voltages obtained by equations (8), (9) and (10), respectively.

Figure 15:
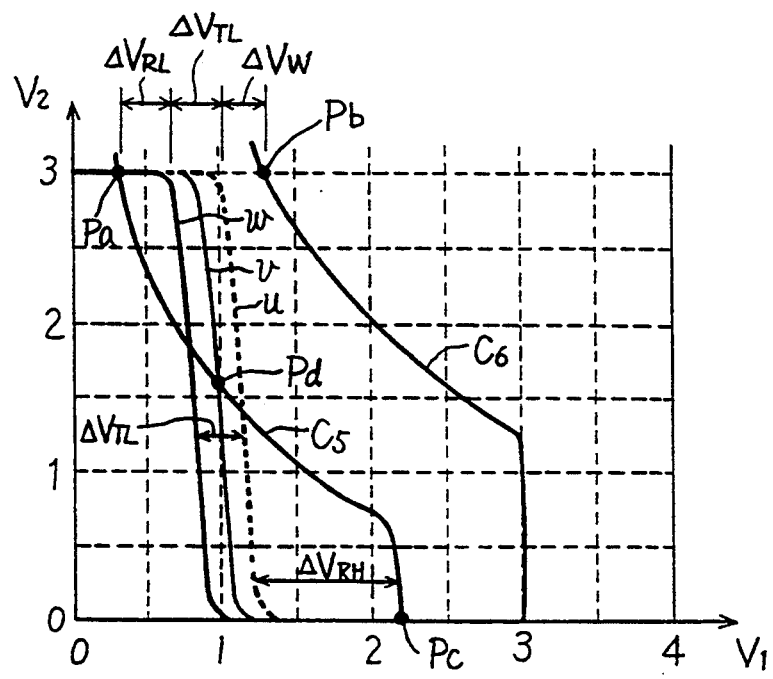
FIG. 15 is an input/output characteristic diagram of inverters 2a and 2b implementing a data storage circuit of FIG. 10.

The other inverter 2b forming the data storage circuit 1 shown in FIG. 10 will be described hereinafter. By carrying out an analysis similar to that of inverter 2a for inverter 2b, the input/output characteristics C5 and C6 shown in FIG. 15 can be obtained. Referring to FIG. 15, the abscissa indicates the voltage V1, and the ordinate indicates the voltage V2. The voltage V2 corresponds to the input voltage of the inverter 2b, and the voltage V1 corresponds to the output voltage of the inverter 2b. When the gate voltages of access gate transistors Q5 and Q6 shown in FIG. 10 are not boosted (that is, when gate voltages of the level of the power supply voltage VDD are applied), the input/output characteristics of inverter 2b is represented by the curve C5. When the gate voltages of transistors Q5 and Q6 are boosted (i.e. when gate voltages exceeding the level of the power supply voltage VDD are applied), the input/output characteristics of inverter 2b is represented by the curve C6. That is to say, the input/output characteristics of the inverter 2b is shifted depending whether the gate voltages of transistors Q5 and Q6 are boosted or not.

It is assumed that inverter 2a has the characteristics represented by the curve v, and inverter 2d has the characteristics represented by curves C5 and C6. In the reading operation, the input/output characteristics of inverter 2b is represented by the curve C5 because the gate voltages of transistors Q5 and Q6 are not boosted. Therefore, curves v and C5 cross at the crossing points of Pa and Pc (the intermediate crossing point of Pd is neglected since it is unstable). In other words, data storage circuit 1 has two stable states, i.e. the crossing points of Pa and Pc when boosting of transistors Q5 and Q6 are not carried out. Therefore, the stored data is maintained at either of the two states of data storage circuit 1.

In writing operation, the gate voltages of transistors Q5 and Q6 are boosted, whereby the input/output characteristics of inverter 2b is shifted as shown by the curve C6. There is no crossing between curves v and C6, so that data storage circuit 1 is brought to an unstable state. During this unstable state, the data signal determined by the potential of the single bit line BL is transmitted to data storage circuit 1 via transistors Q5 and Q6. In other words, the data storage state is easily changed due to the fact that data storage circuit 1 is unstable. As a result, data writing can be carried out easily.

The conditions required for providing the characteristics of the relation shown in FIG. 15 for inverters 2a and 2b will be described hereinafter. It is assumed that the $\beta$ of transistor Q4 is designated by $\beta_{Q4}$. Furthermore, it is assumed that access gate transistors Q5 and Q6 are equivalently represented by one transistor, and the value of $\beta$ of that equivalent transistor is represented as $\beta_{Q56}$.

The beta ratio $\beta r$ is defined as represented by the following equation.

$$\beta r = \beta_{Q4}/\beta_{Q56} \quad (11)$$

Figure 16:
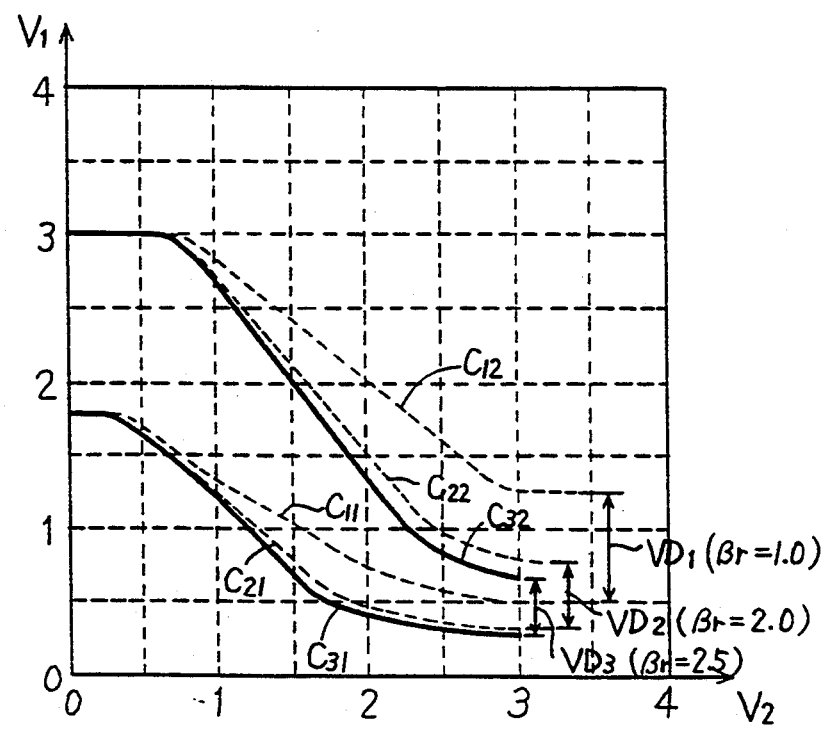
FIG. 16 is an input/output characteristic diagram under various beta ratios of inverter 2b of FIG. 10.

FIG. 16 is a diagram of the input/output characteristics of inverter 2b of FIG. 2 under various beta ratios βr. Referring to FIG. 16, the abscissa indicates the input voltage V2 and the ordinate indicates the output voltage V1 of inverter 2b. The curves C11 and C12 represent the characteristics when βr=1.0. The curves C21 and C22 show the characteristics when βr=2.0. The curves C31 and C32 show the characteristics when βr=2.5. The curves c11, C21, and C31 show the characteristics when the gate voltages of the access gate transistors Q5 and Q6 are not boosted (=VDD=3 volts). The curves C12, C22 and C32 respectively show the characteristics when the gate voltages of transistors Q5 and Q6 are boosted (=5 volts).

It can be appreciated from FIG. 16 that the voltage difference VD1−VD3 is gradually reduced as the beta ratio βr increases.

Referring to FIG. 15 again, the preferable range of a preferable beta ratio βr will be described hereinafter. The curves w and u of FIG. 15 take into consideration the variations of the characteristics of transistors Q1 and Q3 forming inverter 2a. That is to say, the actual characteristics of the inverter 2a exists in the region surrounded by the curves w and u. From FIG. 15, the difference $\Delta V_{TL}$ of the logic threshold value is approximately 0.35 volts.

In the embodiment shown in FIG. 15, the supply voltage VDD is three volts. Therefore, the voltage of the word line activated during the reading operation is three volts. The voltage of the boosted word line during the writing operation is five volts.

The voltage differences of AVRL and AVRH shown in FIG. 15 must take a sufficient great value for the curve C5 to cross at the two crossing points of Pa and Pc with the curve w or u at a data read out state, i.e. at a stable state. Assuming that the voltage difference $\Delta V_{RL}=\Delta V_{RH}=0.2$ volts, the following equation is obtained.

$$V1\,(Pc) - V1\,(Pa) = \Delta V_{RL} + \Delta V_{TL} + \Delta V_{RH} \quad (12)$$
$$= 0.2 + 0.35 + 0.2$$
$$= 0.75\,(V)$$

In a writing operation, it is required that the point Pb does not cross the curve u. Therefore, assuming that $\Delta V_w$ exceeds 0.2 volts, the following relationship can be obtained.

$$V1\,(Pb) - V1\,(Pa) = \Delta V_{RL} + \Delta V_{TL} + \Delta V_W \quad (13)$$
$$= 0.75\,(V)$$

It can be appreciated from equations (12) and (13) that the design must be established so that the voltage difference V1 (Pc)−V1 (Pa) and the voltage difference V1 (Pb)−V1 (Pa) take a value of not less than approximately 0.8 volts.

Figure 17:
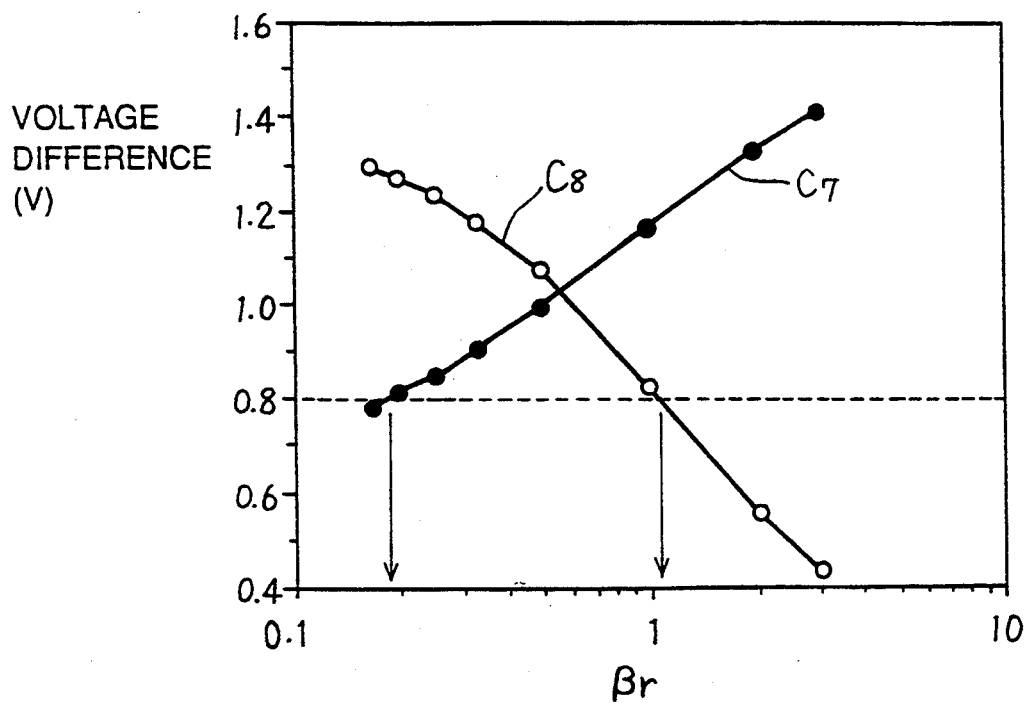
FIG. 17 is a graph for describing a preferable beta ratio range.

FIG. 17 is a graph showing the relationship between the beta ratio βr and the aforementioned voltage difference. Referring to FIG. 17, the abscissa indicates the beta ratio βr, and the ordinate indicates the voltage difference (V). The curve C7 indicates the change of voltage difference V1 (Pc)−V1 (Pa), and the curve C8 indicates the change in the voltage difference V1 (Pb)−V1 (Pa). The voltage difference V1 (Pc)−V1 (Pa) is gradually decreased as the beta ratio βr decreases. This is because the voltage (V1) of the crossing point Pa becomes greater as the beta ratio βr decreases.

The voltage difference V1 (Pb)−V1 (Pa) decreases as the beta ratio βr increases. This is because the crossing points of Pa and Pb both are suppressed at a low value as the beta ratio βr increases. As a result, the preferable range of the beta ratio βr can be obtained by the following inequality.

$$0.2 \leq \beta r \leq 1.0 \quad (14)$$

Therefore, transistors Q4, Q5, and Q6 in memory cell MCa of FIG. 10 are designed to obtain a beta ratio βr that satisfies the inequality of (14). An example of preferable input/output characteristics of the two inverters 2a and 2b are shown in FIG. 18.

Figure 18:
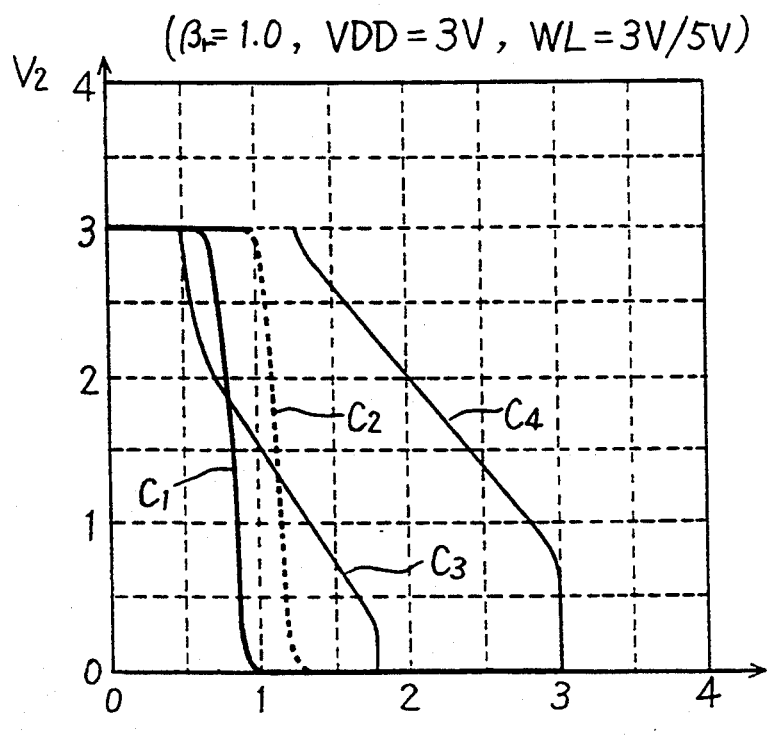
FIG. 18 is a characteristic diagram indicating preferable input/output characteristics of two inverters implementing a data storage circuit of a memory cell.

Referring to FIG. 18, the curves C1 and C2 indicate the input/output characteristics of inverter 2a taking into consideration variation of the characteristics of the transistors Q1 and Q3. The curves C3 and C4 respectively show the input/output characteristics of the reading operation and the writing operation, respectively of inverter 2b. In the example of FIG. 18, the beta ratio βr is 1.0, the supply voltage VDD is 3 volts, the boosted word line voltage is 5 volts, and the not-boosted word line voltage is 3 volts.

By applying inverters 2a and 2b having the input/output characteristics shown in FIG. 15 to the data storage circuit 1 of the memory cell MCa shown in FIG. 10, a preferable SRAM having a single bit line configuration is obtained. More specifically, in each memory cell MCa shown in FIG. 9, access gate transistors Q5 and Q6 boosted via the X word line XWL and the Y word line YWL in the writing operation are provided in each memory cell MCa shown in FIG. 9, so that data writing can be carried out only in the desired memory cell Mca.

Figure 19:
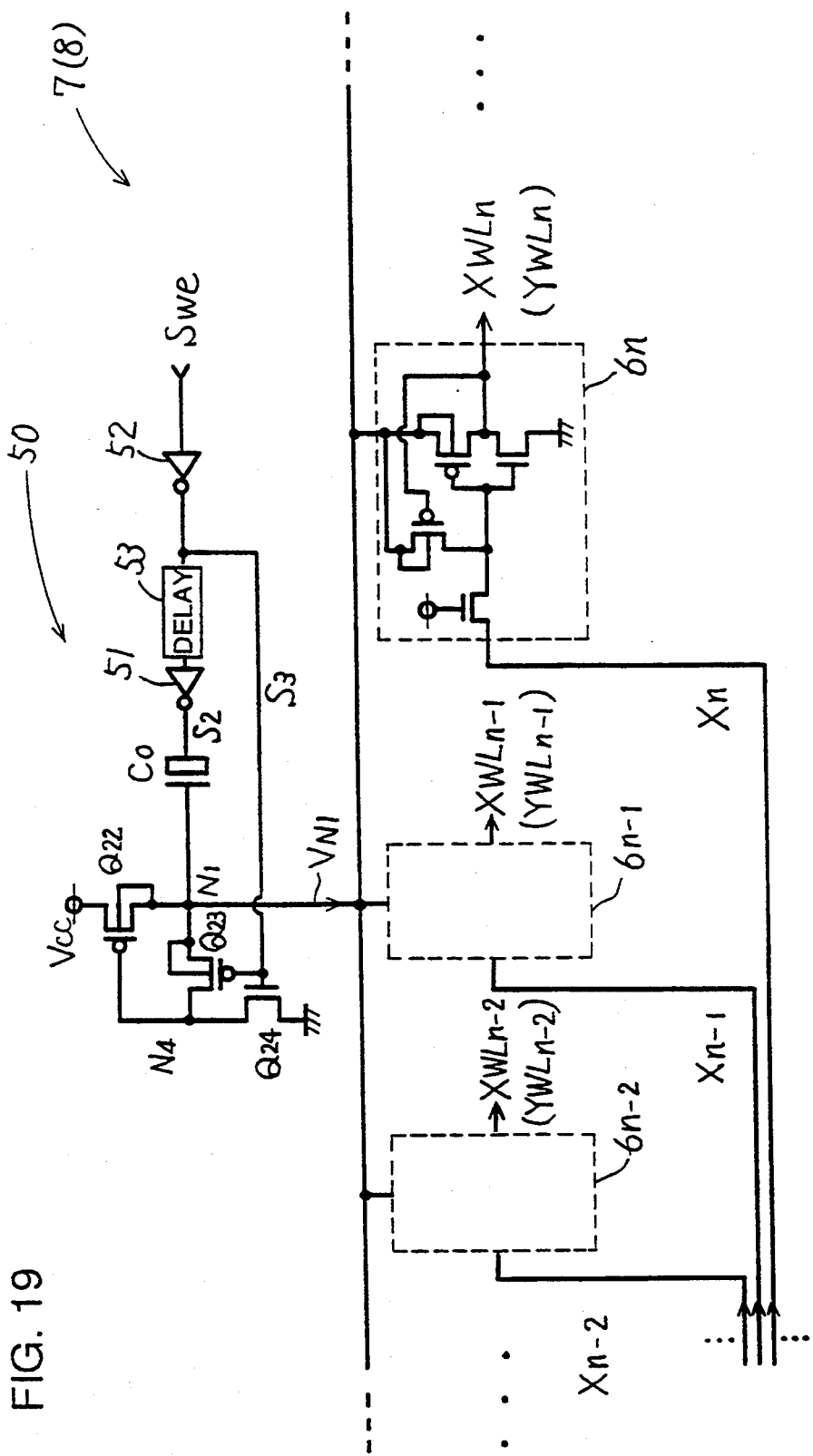
FIG. 19 is a circuit diagram of a X word line boosting circuit (or a Y word line boosting circuit) of FIG. 9.

FIG. 19 is a circuit diagram of X word line boosting circuit 7 (or Y word line boosting circuit 8) shown in FIG. 9. Referring to FIG. 19, X word line boosting circuit 7 (or Y word line boosting circuit 8) includes a boosting circuit 50 including the circuit shown in FIG. 1, and selecting circuits $6_{n-2}$, $6_{n-1}$, and $6_n$ to receive boosted voltage $V_{N1}$ to select an X word line. Boosting circuit 50 includes inverters 51 and 52, and a delay element 53 in addition to the circuit components shown in FIG. 1. Inverter 52 receives a write enable signal Swe provided from inverter 13 of FIG. 9.

Figure 20:
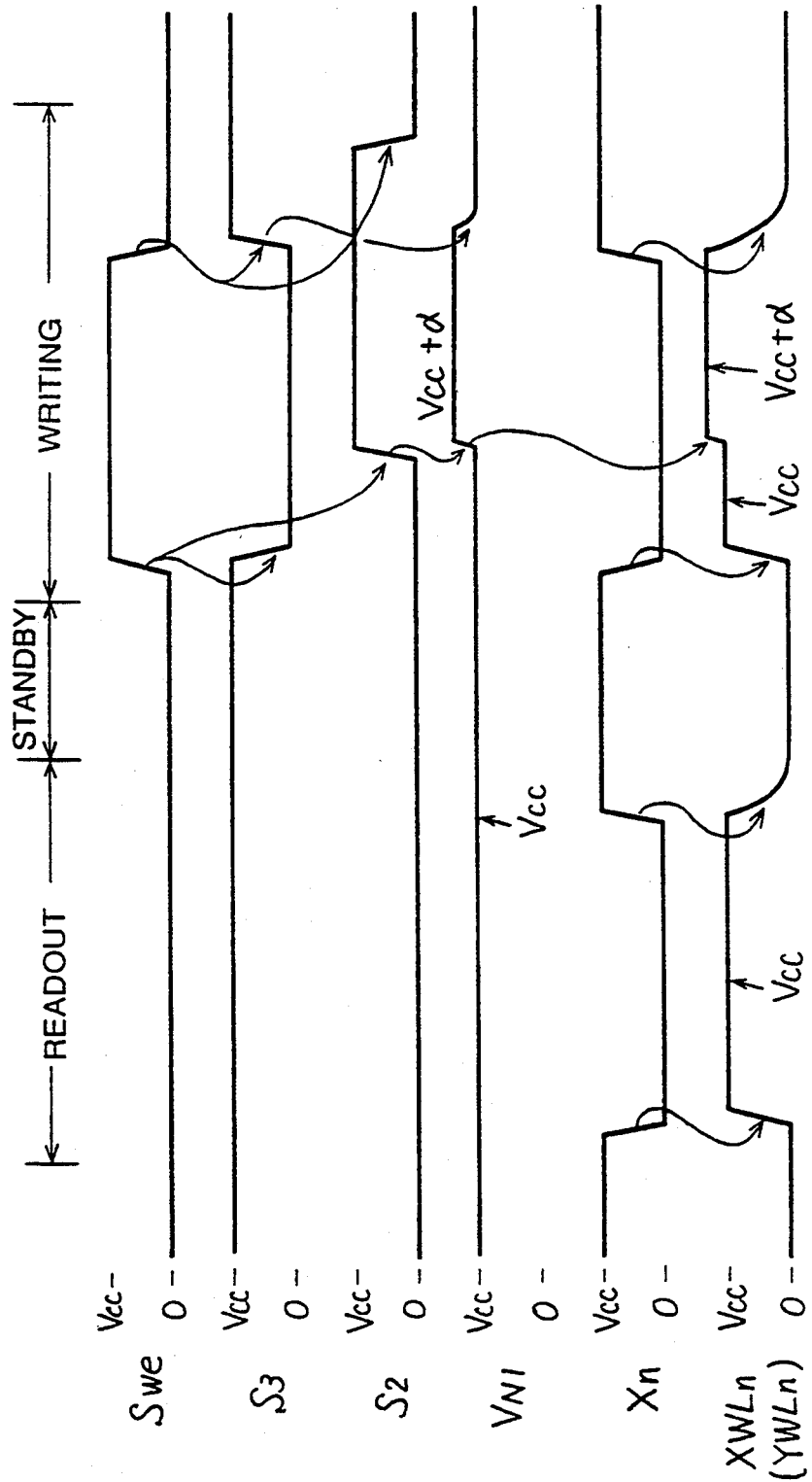
FIG. 20 is a timing chart for describing the operation of the circuit of FIG. 19.

FIG. 20 is a timing chart for describing the operation of the circuit shown in the FIG. 19. Referring to FIG. 20, a write enable signal Swe of a low level is supplied during a read operation term. Therefore, MOS capacitor C0 receives signal S2 of a low level, and the gate electrodes of transistors Q23 and Q24 receive signal S3 of a high level. Therefore, the boosting circuit 50 shown in FIG. 19 is brought to the state prior to boosting during a read operation term. More specifically, transistor Q22 is turned on and transistor Q23 is turned off, whereby an output voltage $V_{N1}$ of the Vcc level is provided.

When an X word line $XWL_n$ is activated during the read operation, for example, a word line selection signal Xn of a low level is provided. Selecting circuit 6n is operated in response to signal Xn, whereby X word line $XWL_n$ attains the level of power supply potential Vcc. The other X word lines are maintained at ground potential.

Then, during a standby term, a write enable signal Swe of a low level is provided. Therefore, the standby term is equivalent to the term prior to boosting. More specifically, transistor Q24 is turned on and transistor Q23 is turned off during the standby term, whereby output node N1 is precharged to power supply potential Vcc via transistor Q22. Because all the word line selection signals $X_{n-2}$, $X_{n-1}$, $X_n$ (or $Y_{n-2}$, $Y_{n-1}$, $Y_n$) of a low level are provided from row decoder 5 (or column decoder 6) shown in FIG. 9 during the standby term, all the X word lines (or Y word lines) are brought to ground potential.

During a write operation term, boosting circuit 50 attains a boosting state. More specifically, a write enable signal Swe of a high level is provided during this term, so that signal S2 rises after the fall of signal S3. The delay element 53 shown in FIG. 19 defines the time length starting from the fall of signal S3 to the rise of signal S2.

The boosting circuit 50 of FIG. 19 provides a boosted voltage $V_{N1}$ of $Vcc + \alpha$ according to a mechanism similar to that of the circuit shown in FIG. 1. For example, when X word line $XWL_n$ is activated during a write operation, selecting circuit 6n is applied with boosted voltage $V_{N1}$, whereby the potential of X word line XWn rises to $Vcc + \alpha$. As a result, a boosted voltage required for data writing in a SRAM having a single bit line configuration is supplied to the word line selected by row decoder 5 (or column decoder 6). A SRAM of low power consumption can be provided by the usage of the boosting circuit of FIG. 19.

Figure 21:
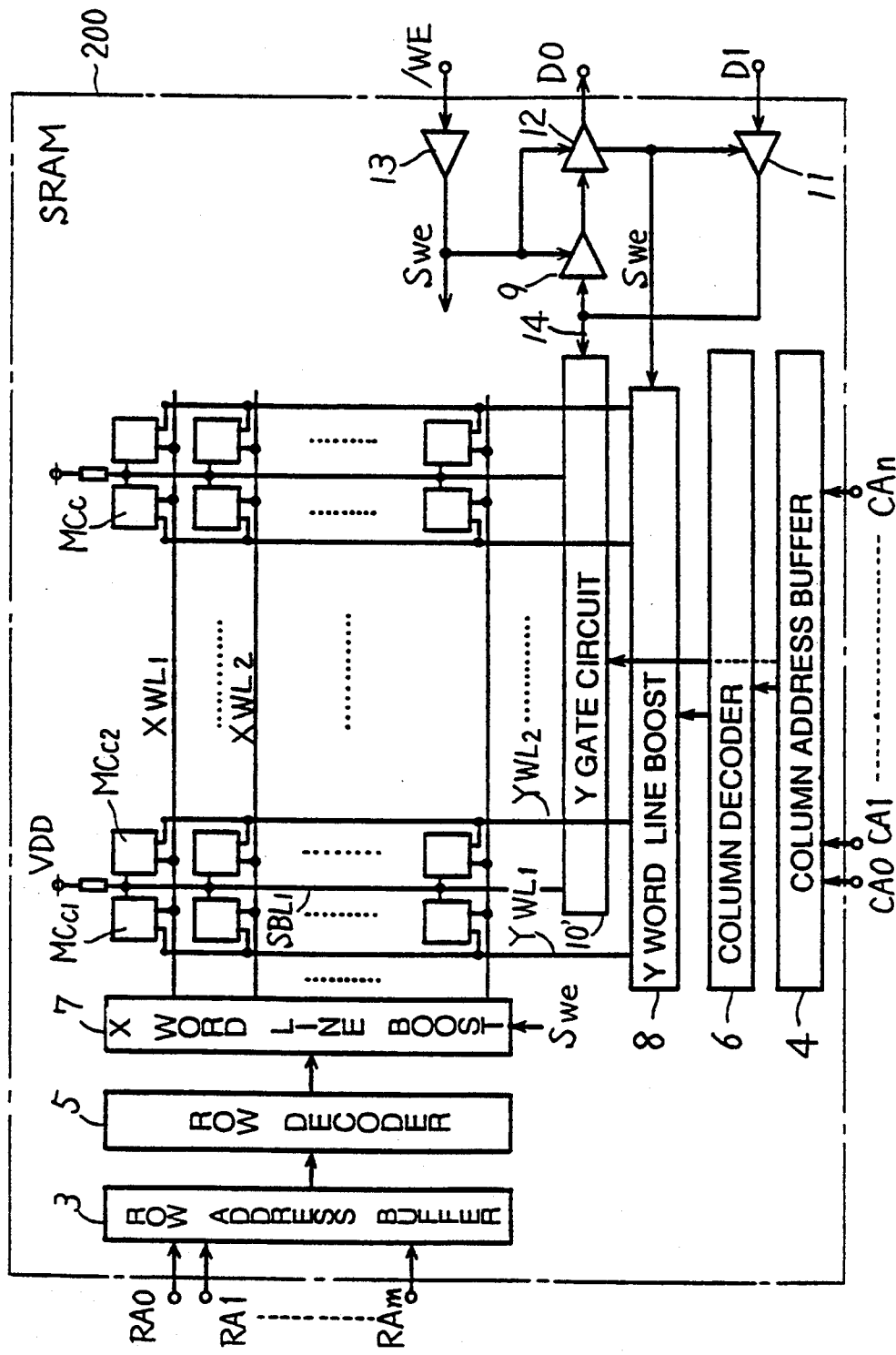
FIG. 21 is a block diagram of a SRAM according to still another embodiment of the present invention.

FIG. 21 is a block diagram of a SRAM showing a still further embodiment of the present invention. Referring to FIG. 21, SRAM 200 has a circuit configuration similar to that of SRAM 100 of FIG. 9, except for a difference in the connection manner of the bit line. More specifically, one shared bit line SBL is provided for every two columns. Therefore, SRAM 200 of FIG. 21 has the number of bit lines reduced to a half of that provided in SRAM 100 of FIG. 9. For example, the two adjacent memory cells MCc1 and MCc2 in the first column are connected to one shared bit line SBL1. The shared bit line SBL1 is connected to a Y gate circuit 10'.

Figure 22:
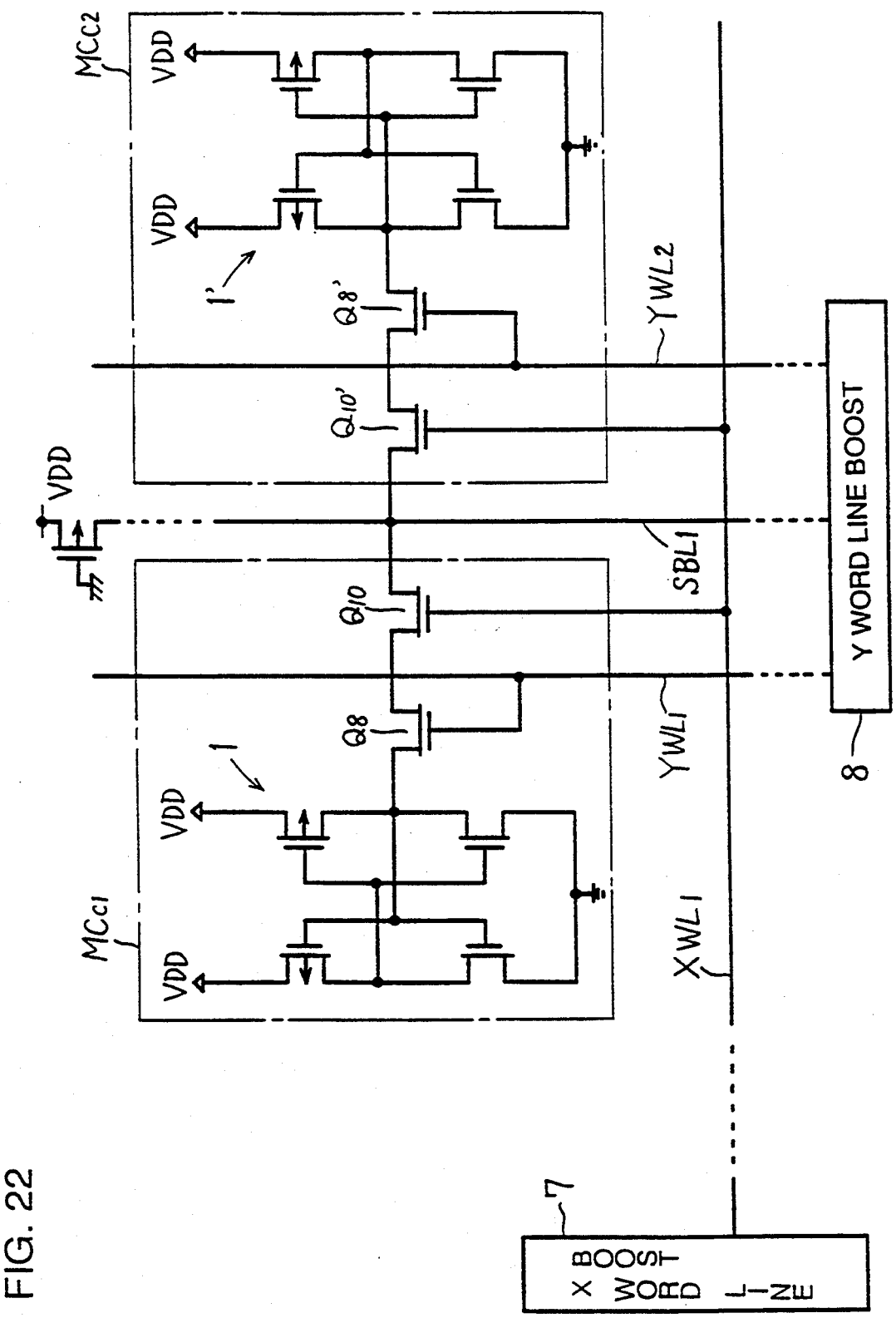
FIG. 22 is a circuit diagram of two adjacent memory cells shown in FIG. 21.

FIG. 22 is a circuit diagram of two adjacent memory cells MCc1 and MCc2 of FIG. 21. Referring to FIG. 22, memory cells MCc1 and MCc2 have a circuit configuration identical in function and symmetrical in configuration. The memory cell MCc1 includes a data storage circuit 1, and NMOS transistors Q8 and Q10 connected in series between data storage circuit 1 and the shared bit line SBL1. Similarly, memory cell MCc2 includes a data storage circuit 1', and NMOS transistors Q8' and Q10' connected in series between the data storage circuit 1' and the shared bit line SBL1. Transistors Q10 and Q10' have the gates connected to the X word line XWL1. Transistor Q8 has the gate connected to Y word line YWL1. Transistor Q8' has the gate connected to Y word line YWL2. Each of memory cells MCc1 and MCc2 shown in FIG. 22 has the circuit characteristics satisfying the relationship shown in FIG. 15, as the memory cell MCa shown in FIG. 10.

Although one shared bit line SBL1 is shared by two memory cells MCc1 and MCc2 in two adjacent columns, no problem will occur by sharing the bit line because transistors Q8 and Q8' will not be turned on at the same time.

More specifically, when data writing is carried out with respect to the memory cell MCc1, the gates of transistors Q10 and Q8 are boosted by X word line boosting circuit 7 and Y word line boosting circuit 8, respectively. Therefore, a data signal determined by the potential of the shared bit line SBL1 is applied to data storage circuit 1 via transistors Q8 and Q10. In the memory cell MCc2 which should not be accessed, the gate voltage of transistor Q10' is boosted by X word line boosting circuit 7, and the gate voltage of transistor Q8' is maintained at a low level. Therefore, transistor Q8' is turned off, so that erroneous data writing to memory cell MCc2 will not be carried out.

In data read out operation, the boosting operations of word line boosting circuits 7 and 8 are suppressed, and the voltage of the level of the power supply voltage VDD is applied to the gates of the transistors of the memory cells to be accessed, for example, to the gates of transistors Q8 and Q10. Therefore, the normal data reading operation is carried out.

The boosting circuit of FIG. 1 applied to a SRAM having a single bit line configuration was described in the foregoing. Another embodiment where a boosting circuit shown in FIG. 23 is used will be described hereinafter.

Figure 23:
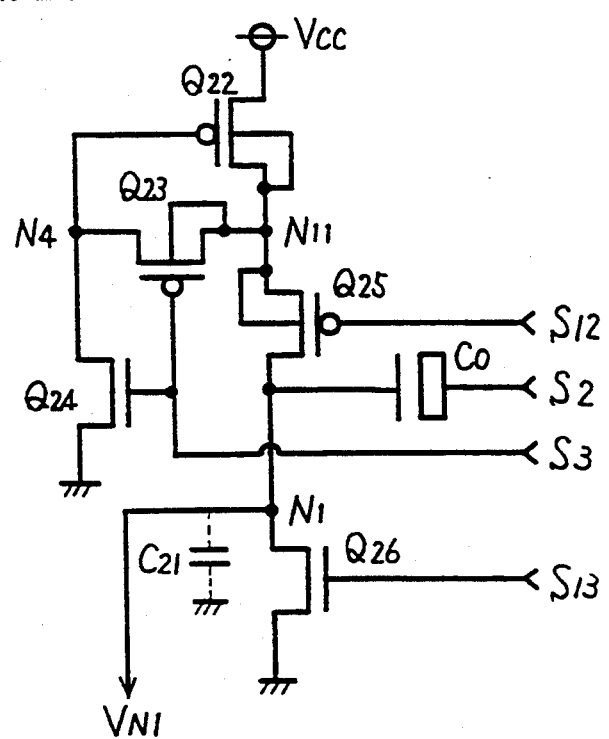
FIG. 23 is a circuit diagram of a boosting circuit according to a still further embodiment of the present invention.

FIG. 23 is a circuit diagram of a boosting circuit showing yet another embodiment of the present invention. Referring to FIG. 23, this boosting circuit includes an PMOS transistor Q25 connected between an output node N1 and the drain electrode of an PMOS transistor Q22, and an NMOS transistor Q26 connected between output node N1 and ground potential. Transistor Q25 has the gate connected to receive a clock signal S12. Transistor Q26 has the gate connected to receive a clock signal S13.

Figure 24:
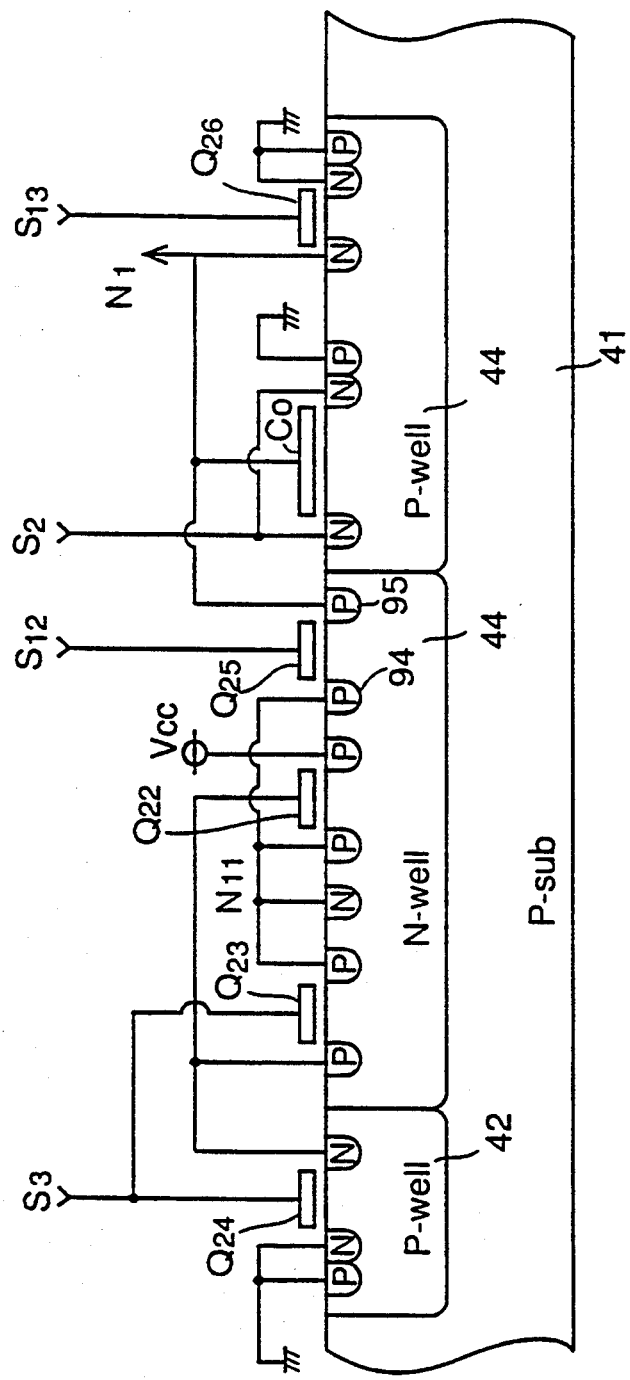
FIG. 24 is a sectional structure view of the boosting circuit of FIG. 23.

FIG. 24 is a sectional structural view of the boosting circuit of FIG. 23. Referring to FIG. 24, P type impurity regions 94 and 95 formed in an N type well 43 implement the source/drain electrodes of transistor Q25.

The boosting circuit of FIG. 23 carries out an operation similar to that of the boosting circuit of FIG. 1 in which the operation thereof is shown by the timing chart of FIG. 2. The boosting circuit of FIG. 23 additionally includes an operation mode set forth in the following.

In this additional operation mode, signal S2 of a low level and signal S3 of a high level are supplied. Additionally, a signal S12 of a high level is provided to the gate of transistor Q25, and a signal S13 of a high level is supplied to the gate electrode of transistor Q26. Therefore, transistor Q25 is turned off and transistor Q26 is turned on. As a result, the potential of the drain electrode of transistor Q22, i.e. the potential of node N11 attains power supply potential Vcc, and the potential of output node N1 attains the level of ground potential during this additional operation mode term.

As a result, the boosting circuit of FIG. 23 can provide the voltages of Vcc, $Vcc + \alpha$ and 0 volts as output voltage $V_{N1}$ during the term prior to boosting, the boosting term, and the additional operation mode term, respectively.

Figure 25:
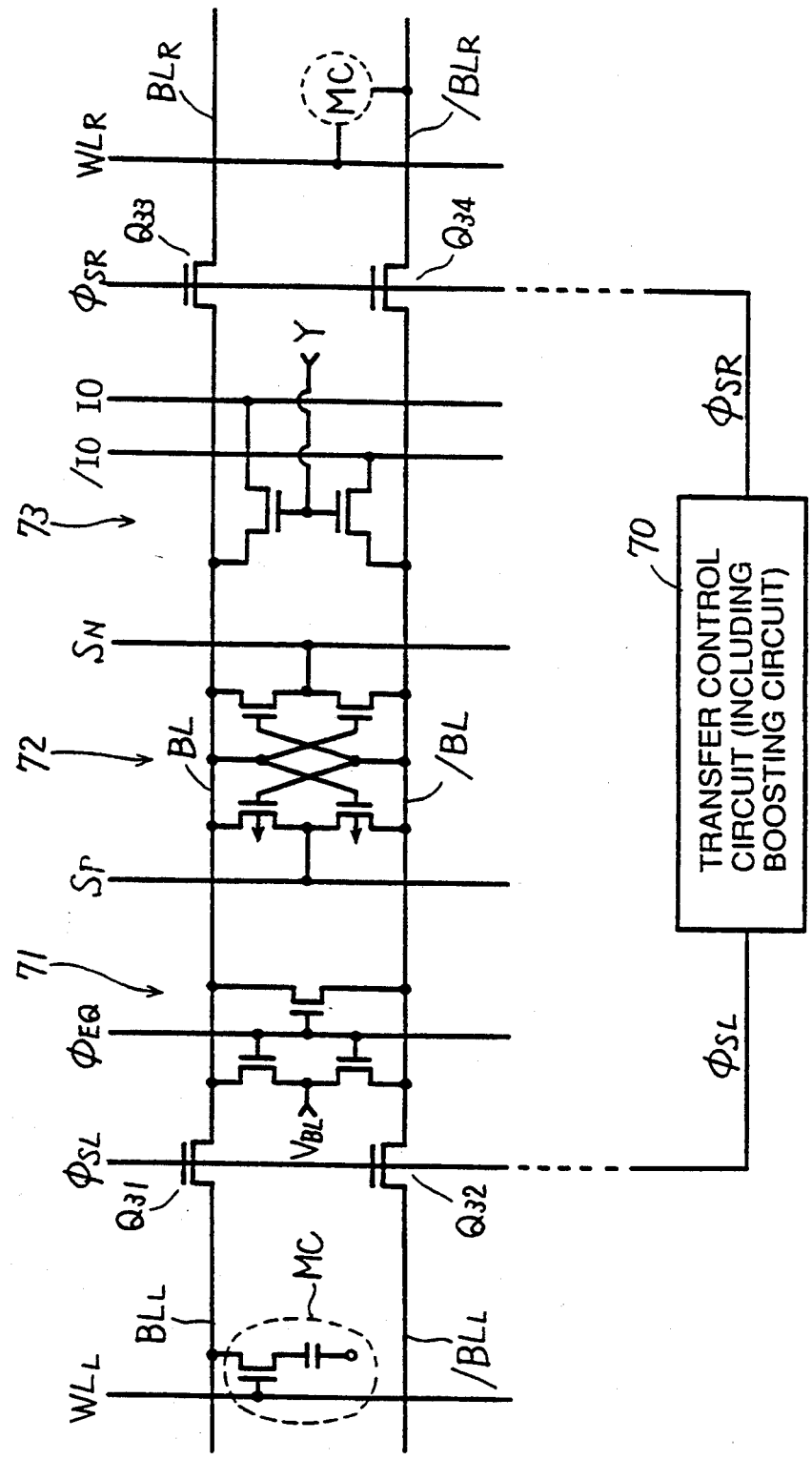
FIG. 25 is a circuit diagram of a bit line peripheral circuit of a DRAM according to yet a further embodiment of the present invention.

An application of the boosting circuit of FIG. 23 in a DRAM including a shared sense amplifier will be described hereinafter. FIG. 25 is a circuit diagram of a bit line peripheral circuit of a DRAM according to yet another embodiment of the present invention. Referring to FIG. 25, a bit line peripheral circuit relating to one column includes an equalize circuit 71 for equalizing a pair of bit lines BL and /BL, a sense amplifier 72 for amplifying the small potential difference between bit lines BL and /BL, and an IO line connection circuit 73 responsive to a column selection signal Y for connecting bit lines BL and /BL to IO lines IO and /IO. Equalize circuit 71 receives a bit line equalized voltage $V_{BL}$. Sense amplifier 72 is activated in response to sense amplifier activation signal $S_B$ and $S_N$.

The pair of bit lines BL and/BL are connected to the left side pair of bit lines $BL_L$ and/$BL_L$ via NMOS transistors Q31 and Q32. The pair of bit lines BL and/BL are connected to the right side pair of bit lines $BL_R$ and /$BL_R$ via NMOS transistors Q33 and Q34. Transfer control circuit 70 including a boosting circuit provides boosted transfer control signal $\phi_{SL}$ and $\phi_{SR}$ to transistors Q31 and Q34.

Figure 26:
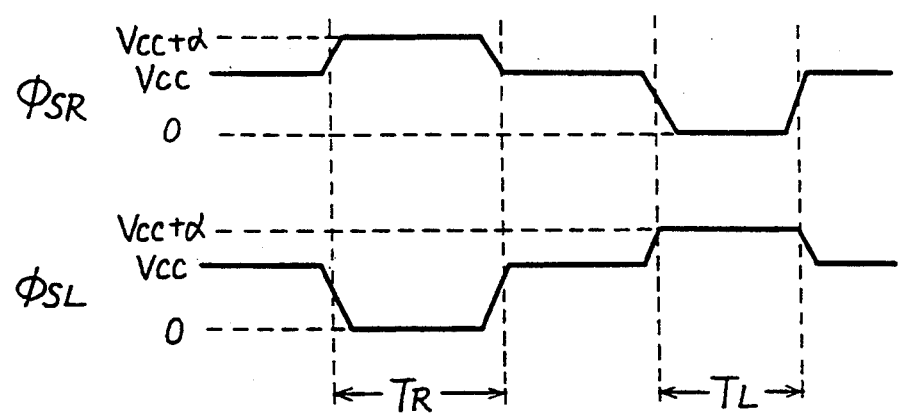
FIG. 26 is a timing chart of a transfer control signal provided from the transfer control circuit of FIG. 25.

FIG. 26 is a timing chart of transfer control signals $\phi_{SL}$ and $\phi_{SR}$ provided from transfer control circuit 70 of FIG. 25. Referring to FIG. 26, transfer control signal $\phi_{SR}$ boosted to the level of Vcc+$\alpha$ is supplied to the gate electrodes of transistors Q33 and Q34 during a term $T_R$ in which the potential difference between the right side bit lines $BL_R$ and/$BL_R$ is amplified by sense amplifier 72. During this term $T_R$, a transfer control signal $\phi_{SL}$ of 0 volt is applied to the gate electrodes of transistors Q31 and Q32. During a term $T_L$ in which the potential difference between the left side bit lines $BL_L$ and/$BL_L$ is amplified by sense amplifier 72, a transfer control signal $\phi_{SL}$ boosted to the level of Vcc+$\alpha$ is supplied to the gate electrode of transistors Q31 and Q32. During this term $T_L$, a transfer control signal $\phi_{SR}$ of 0 volt is applied to the gate electrodes of transistors Q33 and Q34. During other terms, transfer control signals $\phi_{SL}$ and $\phi_{SR}$ of the level of power supply potential Vcc are supplied to the gate electrodes of transistors Q31 and Q34.

Figure 27:
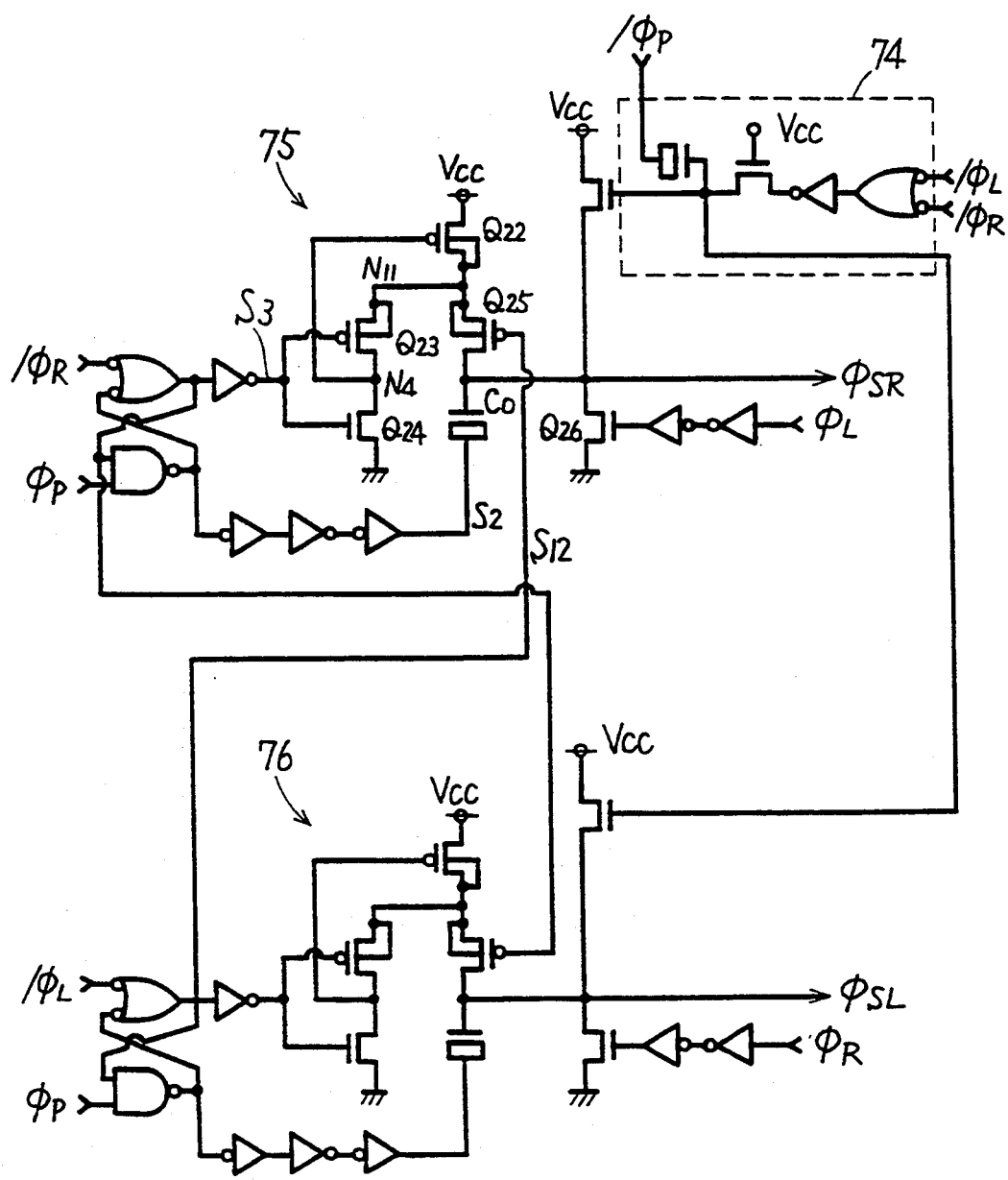
FIG. 27 is a circuit diagram of the transfer control circuit of FIG. 25.

FIG. 27 is a circuit diagram of transfer control circuit 70 shown in FIG. 25. Referring to FIG. 27, this transfer control circuit includes boosting circuits 75 and 76 having a circuit structure substantially identical to that of the boosting circuit of FIG. 23, and an output voltage control circuit 74. Signals $\phi_R$ and/$\phi_R$ request access to a memory cell connected to the right bit line pairs of $BL_R$ and/$BL_R$ shown in FIG. 25. Signals $\phi_L$ and/$\phi_L$ request access to a memory cell connected to the left side bit line pair of $BL_L$ and/$BL_L$. Signal $\phi_p$ and $\phi_p$ request provision of boosted transfer control signals $\phi_{SL}$ and/$\phi_{SR}$. These control signals $\phi_R$, /$\phi_R$, $\phi_L$, /$\phi_L$, $\phi_P$, and/$\phi_P$ are generated from a timing control circuit not shown and provided in the DRAM.

Figure 28:
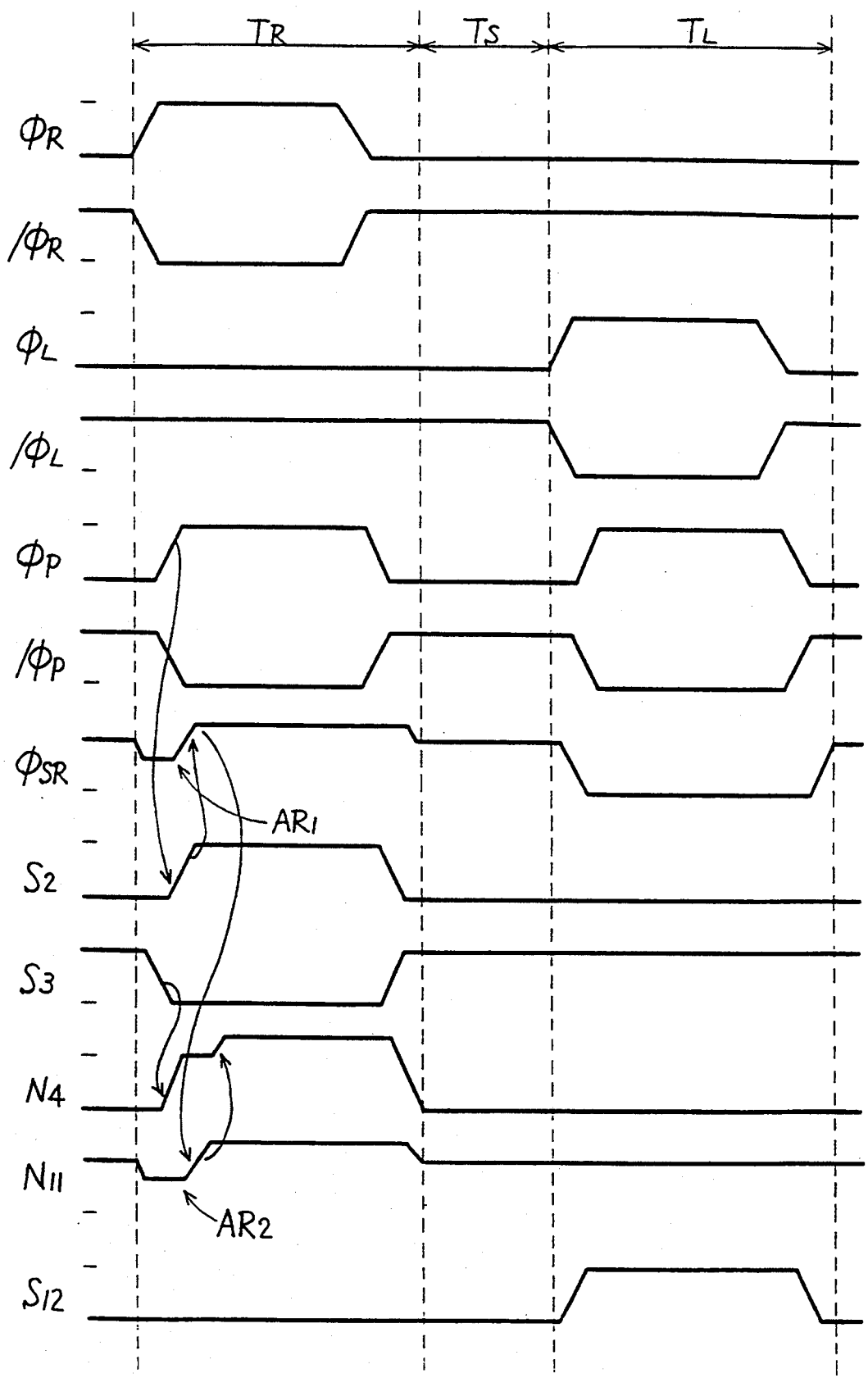
FIG. 28 is a timing chart for describing the operation of the circuit of FIG. 27.

FIG. 28 is a timing chart for describing the operation of the transfer control circuit shown in FIG. 27. During a term $T_R$ in which a memory cell connected to the right bit line pairs of $BL_R$ and/$BL_R$ shown in FIG. 25, signal $\phi_R$ of a high level and signal/$\phi_R$ of a low level are provided. Therefore, signal S3 is pulled down to a low level from a high level, whereby transistor Q23 is turned on and transistor Q24 is turned off. Also, signal $\phi_P$ rises and signal/$\phi_P$ falls, so that signal S2 attains a high level. This causes the output signal, i.e. transfer control signal $\phi_{SR}$ to be boosted by MOS capacitor C0. After boosting, signals $\phi_R$ and/$\phi_R$ attain a low level and a high level, respectively, and signals $\phi_P$ and/$\phi_P$ attain a low level and a high level, respectively. As a result, transfer control signal $\phi_{SR}$ returns to the level of power supply potential Vcc. The output voltage control circuit 74 of FIG. 27 assists the boosted signal $\phi_{SR}$ to return to the level of Vcc.

During a standby term Ts, signals $\phi_R$, $\phi_L$, $\phi_P$ of a low level, and signals/$\phi_R$, /$\phi_L$, /$\phi_P$ of a high level are provided. Therefore, signals S2, S3, and S12 attain a low level, a high level and a low level, respectively. Because signal S3 is of a high level, transistor Q23 is turned off and transistor Q24 is turned on. As a result, node N4 is brought to the potential of 0 volt, and transistor Q22 is turned on. Because signal S12 is of a low level, transistor Q25 is turned on, and a transfer control signal $\phi_{SR}$ of Vcc level is provided.

During term $T_L$ in which a memory cell connected to the left side pair of bit lines $BL_L$ and/$BL_L$ is accessed, a signal $\phi_L$ of a high level and signal/$\phi_L$ of a low level are provided. As a result, signals S2 and S3 attain a low level and a high level, respectively. Because signal S12 attains a high level, transistor Q25 is turned off. Also, transistor Q26 is turned on, whereby a transfer control signal $\phi_{SR}$ having the level of ground potential is provided.

Because the transfer control circuit of FIG. 27 provides boosted transfer control signals $\phi_{SL}$ and $\phi_{SR}$ to the gate electrodes of transistors Q31 and Q34 during the term where sense amplifier 72 shown in FIG. 25 is activated, the voltage amplified by sense amplifier 72 can be transmitted to the bit line pairs of $BL_L$, /$BL_L$ and $BL_R$, /$BL_R$ without being reduced. More specifically, because sufficiently boosted signals $\phi_{SR}$ and/$\phi_{SR}$ are provided to the gate electrodes of transistors Q31 and Q34 by the transfer control circuit of FIG. 27, these transistors Q31-Q34 are turned on at a lower conductive resistance. Therefore, reduction in the voltage amplified by sense amplifier 72 can be prevented.

However, the transfer control circuit of FIG. 27 may have the following problem. Referring to FIG. 28 again, the potentials of output signal $\phi_{SR}$ and node N11 are reduced temporarily as shown by arrows AR1 and AR2 during the first short period in term $T_R$. This means that a sufficient boosted voltage cannot be obtained during this short time period to result in the possibility of delay in operation. An improved transfer control circuit to solve such a problem is shown in FIG. 29.

Figure 29:
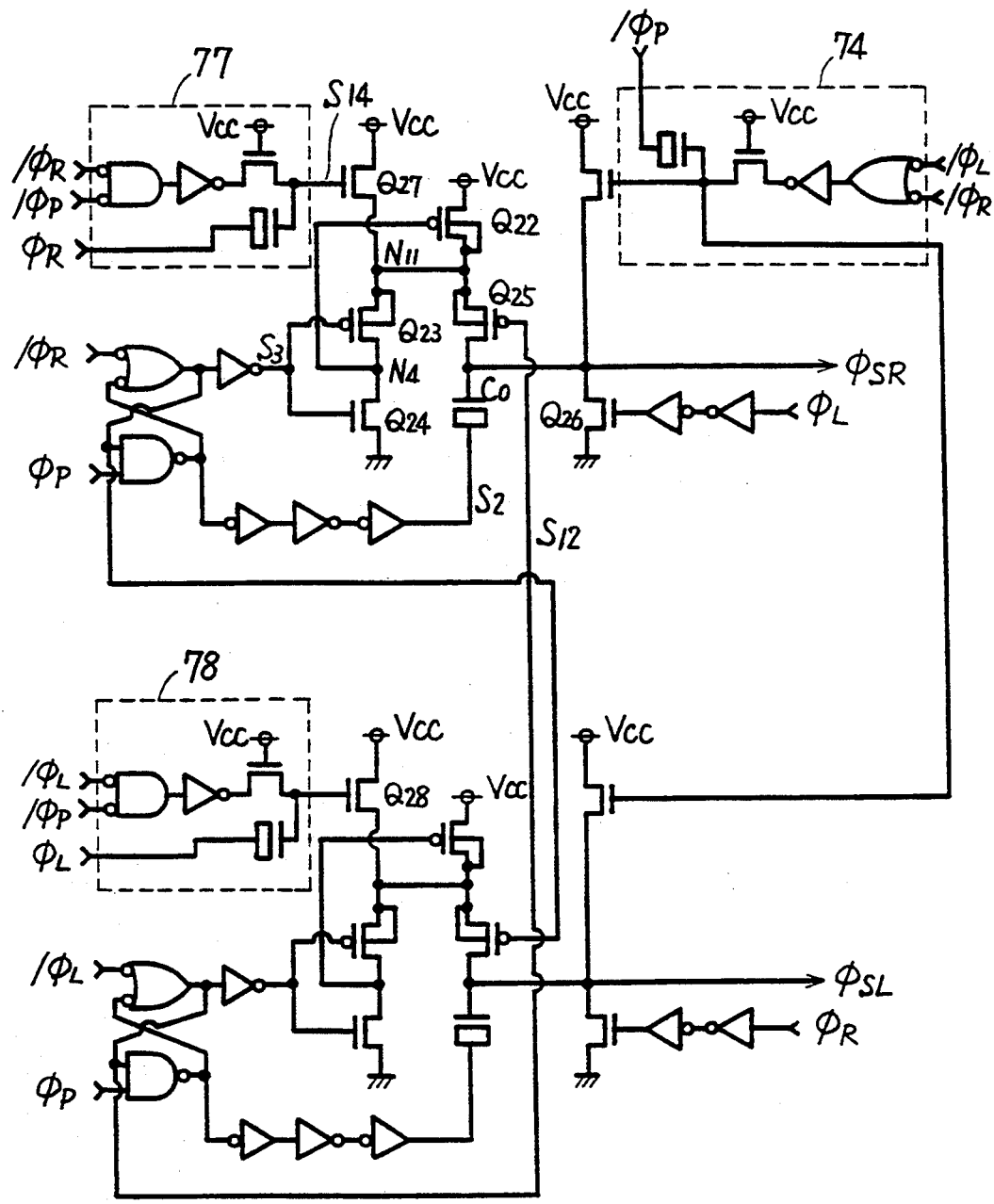
FIG. 29 is a circuit diagram of an improved transfer control circuit showing yet another embodiment of the present invention.

FIG. 29 is a circuit diagram of an improved transfer control circuit according to yet another embodiment of the present invention. The circuit shown in FIG. 29 can be used as the transfer control circuit 70 shown in FIG. 25. Referring to FIG. 29, the improved transfer control circuit further includes, in comparison with the circuit shown in FIG. 27, an NMOS transistor Q27 connected between power supply potential Vcc and node N11, and a boosting circuit 77 for boosting the gate electrode of transistor Q27. Regarding the left side transfer control signal an NMOS transistor Q28 and a boosting circuit 78 are added, as in the right side transfer control signal. The additional circuits operate as follows.

Figure 30:
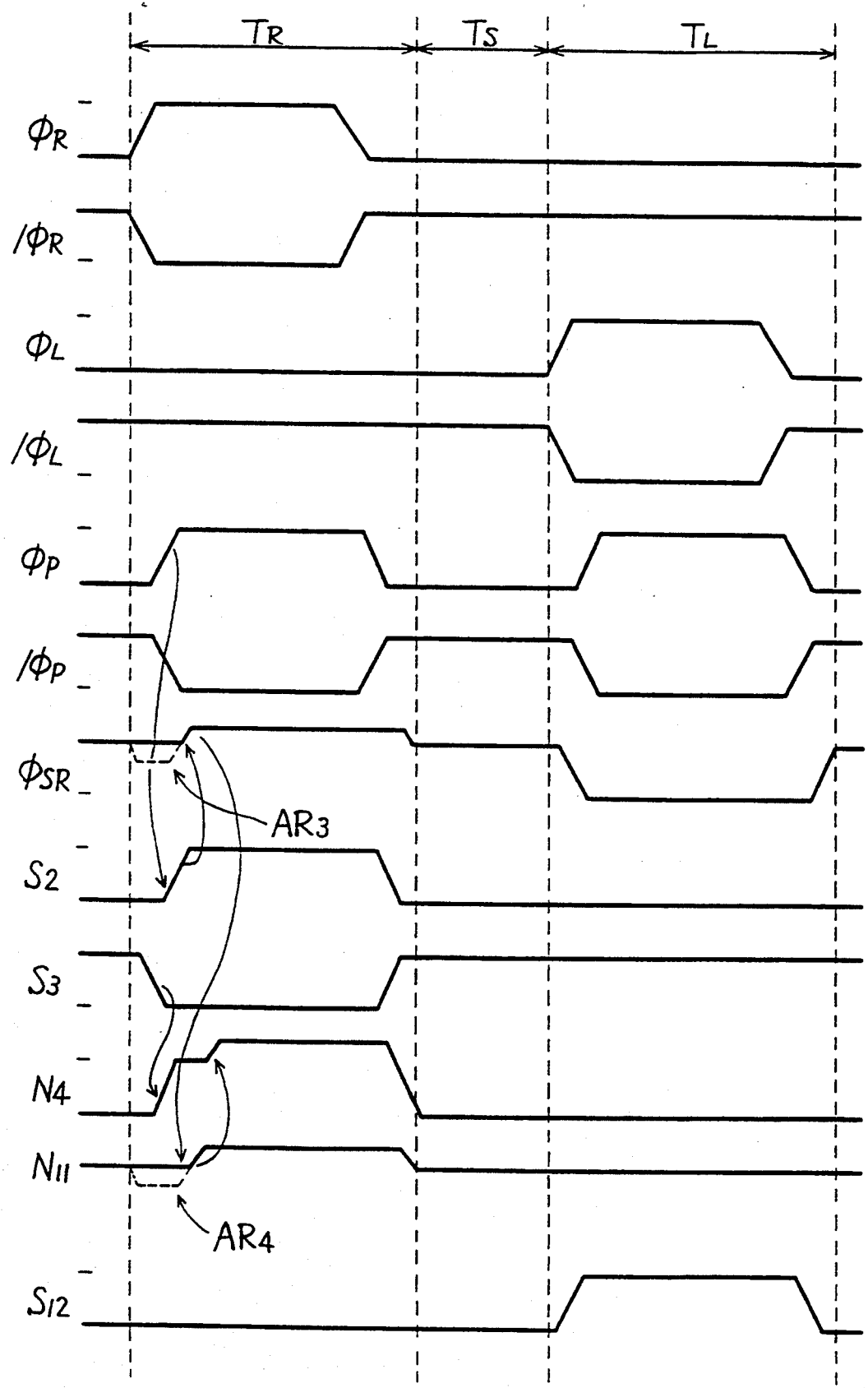
FIG. 30 is a timing chart for describing the operation of the circuit shown in FIG. 29.
Figure 31:
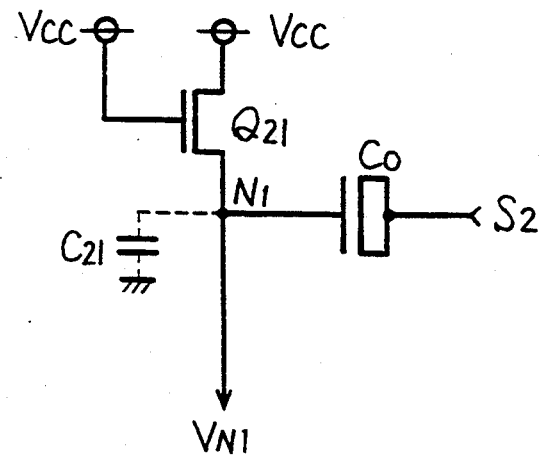
FIG. 31 is a circuit diagram of a conventional boosting circuit.

When signal $\phi_R$ rises, boosted signal S14 is supplied to the gate electrode of transistor Q27. Therefore, transistor Q27 is turned on at a lower conductive resistance, and the potential of node N11 is clamped at power supply potential Vcc. Thus, the potential of output signal $\phi_{SR}$ is prevented from being reduced as shown by arrows AR3 and AR4 in the timing chart of FIG. 30. In other words, the reduction of potential shown in the arrows AR1 and AR2 in FIG. 28 are compensated for.

When a signal $\phi_P$ of a high level and signal/$\phi_P$ of low level are provided, a signal S14 of a low level is supplied to the gate electrode of transistor Q27. As a result, transistor Q27 is turned off, whereby node N11 is disconnected from the power supply potential prior to boosting.

Although the above-embodiments were described in which the basic boosting circuit shown in FIGS. 1 and 23 are applied in a SRAM and a DRAM, the boosting circuit of the present application may widely be used in various semiconductor devices. The boosting circuit of the present invention can be is used in any semiconductor device that requires boosted voltage exceeding a predetermined level of power supply voltage. Because the boosting circuit of the present invention has a large operable margin of power supply voltage as shown in FIG. 32 (b), it may be applied in various semiconductor devices according to the current trend of a lower power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A boosting circuit comprising:
   means for generating first and second clock signals defining a non-boosting term and a boosting term, respectively,
   capacitor means having a first electrode connected to receive the second clock signal and a second electrode connected to an output node,
   forcing means connected between a first power supply potential and said output node, responsive to the first clock signal for forcing said output node to said first power supply potential during said non-boosting term, and to a high impedance state during said boosting term,
   wherein said forcing means comprises
      power supply potential applying means including first switching means connected between said first power supply potential and said output node, responsive to the first clock signal for applying said first power supply potential to said output node during said non-boosting term, and
      high impedance forcing means including switching control means responsive to the first clock signal for forcing said output node to a high impedance state with respect to said first power supply potential during said boosting term,
      said first switching means being operative in response to an output signal provided from said switching control means,
   said boosting circuit further comprising a semiconductor substrate,
   wherein said capacitor means and said switching control means are formed in said substrate,
   said first switching means comprising a first field effect transistor of a first conductivity type formed in said substrate and connected between said first power supply potential and said output node,
   said first field effect transistor having a control gate connected to receive an output signal provided from said switching control means and a backgate electrode connected to said output node.

2. The boosting circuit according to claim 1, wherein said capacitor means comprises a field effect capacitor formed in said substrate,
   said field effect capacitor having a first electrode connected to receive the second clock signal and a second electrode connected to said output node.

3. The boosting circuit according to claim 1, wherein said switching control means comprises
   first applying means formed in said substrate, responsive to the first clock signal for applying a second power supply potential to the control gate electrode of said first field effect transistor during said non-boosting term,
   second applying means formed in said substrate, and responsive to the first clock signal for applying the potential of said output node to the control gate electrode of said first field effect transistor during said boosting term.

4. The boosting circuit according to claim 3, wherein said means for generating first and second clock signals comprises means for generating first and second complementary clock signals,
   said field effect capacitor having a first electrode connected to receive the second complementary clock signal,
   wherein said first applying means comprises a second field effect transistor of a second conductivity type connected between said second power supply potential and the control gate electrode of said first field effect transistor, and having a control gate connected to receive the first complementary clock signal,
   said second conductivity type being opposite to said first conductivity type,
   wherein said second applying means comprises a third field effect transistor of said first conductivity type connected between said output node and the control gate electrode of said first field effect transistor, and having a control gate electrode connected to receive said first complementary clock signal and a backgate electrode connected to said output node.

5. A boosting circuit comprising:
   means for generating first and second clock signals defining a non-boosting term and a boosting term, respectively, wherein said non-boosting term comprises first and second non-boosting terms,
   capacitor means having a first electrode connected to receive the second clock signal and a second electrode connected to an output node, and
   forcing means comprising
      power supply potential applying means connected between a first power supply potential and said output node, responsive to the first clock signal for applying said first power supply potential to said output node during said non-boosting term, said power supply applying means including first switching means,
      high impedance forcing means responsive to the first clock signal for forcing said output node to a high impedance state with respect to said first power supply potential during said boosting term, and
      wherein said forcing means further comprises second switching means connected between said power supply potential applying means and said output node, and made conductive during said first non-boosting term and made non-conductive during said second non-boosting term.

6. The boosting circuit according to claim 5, further comprising third switching means connected between said output node and a second power supply potential for being made conductive during said second non-boosting term.

7. The boosting circuit according to claim 6, wherein said second switching means comprises a fourth field effect transistor of the first conductivity type connected between said power supply potential applying means and said output node,
  wherein said third switching means comprises a fifth field effect transistor of a second conductivity type opposite to the first conductivity type, and connected between said output node and said second power supply potential.

8. A boosting circuit comprising:
means for generating first and second complementary clock signals for boosting,
an MOS capacitor having a first electrode connected to receive said first complementary clock signal and a second electrode connected to an output node,
a first field effect transistor of a first conductivity type connected between a first power supply potential and said output node and having a backgate electrode connected to said output node,
a second field effect transistor of said first conductivity type connected between said output node and the control gate electrode of said first field effect transistor, and having a backgate electrode connected to said output node,
a third field effect transistor of a second conductivity type opposite to said first conductivity type, connected between said second power supply potential and the control gate electrode of said first field effect transistor,
wherein said second and third field effect transistors have the gate electrode connected to receive said second complementary clock signal.

9. A boosting circuit comprising:
means for generating first and second complementary clock signals for boosting,
a MOS capacitor having a first electrode connected to receive said first complementary clock signal, and a second electrode connected to an output node,
a first field effect transistor of a first conductivity type and a first switching means connected in series between a first power supply potential and said output node,
a second field effect transistor of the first conductivity type connected between the control gate electrode of said first field effect transistor and a common connection node of said first field effect transistor and said first switching means,
said first and second field effect transistors having the backgate electrodes connected to said common connection node,
a third field effect transistor of a second conductivity type opposite to said first conductivity type, connected between a second power supply potential and the control gate electrode of said first field effect transistor,
said second and third field effect transistors having control gate electrodes connected to receive said second complementary clock signal,
second switching means connected between said second power supply potential and said output node,
said first and second switching means being made conductive alternately in response to a supplied output control signal.

10. The boosting circuit according to claim 9, wherein said first switching means comprises a fourth field effect transistor of the first conductivity type, connected between said first field effect transistor and said output node, said fourth field effect transistor having a backgate electrode connected to said common connection node,
  wherein said second switching means comprises a fifth field effect transistor of a second conductivity type, connected between said second power supply potential and said output node,
said fourth and fifth field effect transistors being made conductive alternately in response to a supplied output control signal.

11. A static random access memory device comprising:
a memory cell array having a plurality of memory cells arranged in a plurality of rows and columns,
a plurality of bit lines each provided in a corresponding column in said memory cell array and connected to the memory cells in said corresponding column,
wherein each of said memory cells comprises
  data storage means having a single input and output node for storing a data signal applied via said input and output node,
  said data storage means being supplied with a power supply voltage having a predetermined voltage level,
  first and second field effect transistors connected in series between a bit line of a corresponding column and said input and output node,
  first boosting means responsive to an externally applied write control signal for boosting the gate voltage of respective first field effect transistors in the memory cells of a row selected by a row address signal to a voltage level exceeding said power supply voltage,
  second boosting means responsive to an externally applied write control signal for boosting the gate voltage of respective second field effect transistors in the memory cells of a column selected by a column address signal to a voltage level exceeding said power supply voltage,
  wherein each of said first and second boosting means are implemented by a boosting circuit comprising
    means for generating first and second clock signals defining a non-boosting term and a boosting term, respectively,
    capacitor means having a first electrode connected to receive the second clock signal and a second electrode connected to an output node,
    forcing means connected between a first power supply potential and said output node, responsive to the first clock signal for forcing said output node to said first power supply potential during said non-boosting term, and to a high impedance state during said boosting term, and
    wherein said clock signal generating means generates said clock signals in response to said write control signal.

12. A static random access memory device comprising:
a memory cell array having a plurality of memory cells arranged in a plurality of rows and columns,
a plurality of common bit lines, each being provided for every two corresponding columns in said memory cell array, and connected to the memory cells in said two corresponding columns,
wherein each of said memory cells comprises data storage means having a signal input and output node for storing a data signal applied via said input and output node, said data storage means being supplied with a power supply voltage having a predetermined voltage level, first and second field effect transistors connected in series between a common bit line of two corresponding columns and said input and output node, first boosting means responsive to an externally applied write control signal for boosting the gate voltage of respective first field effect transistors in the memory cells of a row selected by a row address signal to a voltage level exceeding said power supply voltage, second boosting means responsive to a write control signal for boosting the gate electrode of respective second field effect transistors in memory cells of a column selected by a column address signal to a voltage level exceeding said power supply voltage, wherein each of said first and second boosting means are implemented by a boosting circuit comprising means for generating first and second clock signals defining a non-boosting term and a boosting term respectively, capacitor means having a first electrode connected to receive the second clock signal and a second electrode connected to an output node, forcing means connected between a first power supply potential and said output node, responsive to the first clock signal for forcing said output node to said first power supply potential during said non-boosting term, and to a high impedance state during said boosting term, and wherein said clock signal generating means generates said clock signals in response to said write control signal.

13. A semiconductor integrated circuit device comprising:

first and second data lines for transmitting data, a field effect transistor connected between said first and second data lines and having a control gate electrode, boosting means for boosting said control gate electrode of said field effect transistor in a data transmission mode, wherein said boosting means is implemented by a boosting circuit comprising means for generating first and second clock signals defining a non-boosting term and a boosting term, respectively, capacitor means having a first electrode connected to receive the second clock signal and a second electrode connected to an output node, forcing means connected between a first power supply potential and said output node, responsive to the first clock signal for forcing said output node to said first power supply potential during said non-boosting term and further including means for forcing said output node to a high impedance state during said boosting term, and wherein said output node is connected to said control gate electrode of said field effect transistor.

14. A semiconductor integrated circuit device according to claim 13, wherein said power supply potential is a positive power supply potential, said field effect transistor comprises an N channel type MOS transistor, said boosting means boosts the control gate electrode of said MOS transistor to a potential exceeding said positive power supply potential.

15. A dynamic random access memory device comprising:

a data line, amplifier means for amplifying a data signal on a data line, first and second memory cells for storing data, a first bit line connected to said first memory cell for transmitting a data signal provided from said first memory cell, a first field effect transistor connected between said data line and said first bit line, and having a control gate electrode, a second bit line connected to said second memory cell for transmitting a data signal provided from said second memory cell, a second field effect transistor connected between said data line and said second bit line, and having a control gate electrode, alternate boosting means for alternately boosting and forcing to ground potential the control gate electrodes of said first and second field effect transistors, wherein said alternate boosting means comprises first and second boosting circuit means, each being formed by a boosting circuit comprising means for generating first and second clock signals defining a non-boosting term and a boosting term respectively, capacitor means having a first electrode connected to receive the second clock signal and a second electrode connected to an output node, and forcing means connected between a first power supply potential and said output node, responsive to the first clock signal for forcing said output node to said first power supply potential during said non-boosting term, and to a high impedance state during said boosting term.

* * * * *